United States Patent
Savas et al.

(10) Patent No.: US 10,544,519 B2
(45) Date of Patent: Jan. 28, 2020

(54) METHOD AND APPARATUS FOR SURFACE PREPARATION PRIOR TO EPITAXIAL DEPOSITION

(71) Applicant: AIXTRON SE, Herzogenrath (DE)

(72) Inventors: Stephen Edward Savas, Pleasanton, CA (US); Miguel Angel Saldana, Santa Cruz, CA (US); Dan Lester Cossentine, Santa Cruz, CA (US); Hae Young Kim, San Jose, CA (US); Subramanian Tamilmani, Fremont, CA (US); Niloy Mukherjee, Dublin, CA (US); M Ziaul Karim, San Jose, CA (US)

(73) Assignee: AIXTRON SE, Herzogenrath (DE)

( * ) Notice: Subject to any disclaimer, the term of this patent is extended or adjusted under 35 U.S.C. 154(b) by 218 days.

(21) Appl. No.: 15/687,006

(22) Filed: Aug. 25, 2017

(65) Prior Publication Data
US 2019/0062947 A1    Feb. 28, 2019

(51) Int. Cl.
*C30B 25/08*    (2006.01)
*C30B 25/18*    (2006.01)
(Continued)

(52) U.S. Cl.
CPC ............ *C30B 25/186* (2013.01); *C30B 25/08* (2013.01); *H01J 37/32495* (2013.01);
(Continued)

(58) Field of Classification Search
CPC ........ C30B 25/08; C30B 25/186; H01J 37/32; H01J 27/32495; H01J 37/32522; H01J 37/32504
See application file for complete search history.

(56) References Cited

U.S. PATENT DOCUMENTS 5,252,181 A    10/1993 Dutartre et al.
5,903,106 A    5/1999 Young et al.
(Continued)

FOREIGN PATENT DOCUMENTS

EP    1081751 A2    3/2001
EP    1365446 A1    11/2003
(Continued)

OTHER PUBLICATIONS

International Search Report dated Nov. 7, 2018, from the ISA/European Patent Office, for International Patent Application No. PCT/EP2018/072776 (filed Aug. 23, 2018), 4 pages.
(Continued)

*Primary Examiner* — Robert M Kunemund
(74) *Attorney, Agent, or Firm* — Ascenda Law Group, PC

(57) ABSTRACT

During a pre-treat process, hydrogen plasma is used to remove contaminants (e.g., oxygen, carbon) from a surface of a wafer. The hydrogen plasma may be injected into the plasma chamber via an elongated injector nozzle. Using such elongated injector nozzle, a flow of hydrogen plasma with a significant radial velocity flows over the wafer surface, and transports volatile compounds and other contaminant away from the wafer surface to an exhaust manifold. A protective liner made from crystalline silicon or polysilicon may be disposed on an inner surface of the plasma chamber to prevent contaminants from being released from the surface of the plasma chamber. To further decrease the sources of contaminants, an exhaust restrictor made from silicon may be employed to prevent hydrogen plasma from flowing into the exhaust manifold and prevent volatile compounds and other contaminants from flowing from the exhaust manifold back into the plasma chamber.

20 Claims, 14 Drawing Sheets

(51) Int. Cl.
   *H01J 37/32*       (2006.01)
   *H01L 21/02*       (2006.01)
   *H01L 21/3065*     (2006.01)
   *H01L 21/67*       (2006.01)
   *H01L 21/687*      (2006.01)

(52) U.S. Cl.
   CPC .. *H01J 37/32504* (2013.01); *H01J 37/32522* (2013.01); *H01L 21/02002* (2013.01); *H01L 21/02043* (2013.01); *H01L 21/02315* (2013.01); *H01L 21/3065* (2013.01); *H01L 21/67051* (2013.01); *H01L 21/68707* (2013.01); *H01L 2924/3011* (2013.01)

(56) References Cited

U.S. PATENT DOCUMENTS

| | | | |
|---|---|---|---|
| 6,776,170 B2 | 8/2004 | Liu | |
| 6,811,448 B1 | 11/2004 | Paton et al. | |
| 6,995,077 B2 | 2/2006 | Siebert et al. | |
| 7,053,002 B2 | 5/2006 | Cohen et al. | |
| 8,152,918 B2 | 4/2012 | Zhang et al. | |
| 8,501,629 B2 | 8/2013 | Tang et al. | |
| 2008/0283500 A1* | 11/2008 | Motokawa | H01J 37/321 216/68 |
| 2014/0011339 A1 | 1/2014 | Zheng et al. | |
| 2015/0126035 A1* | 5/2015 | Diao | H01J 37/321 438/710 |

FOREIGN PATENT DOCUMENTS

| | | |
|---|---|---|
| WO | 01/13403 A1 | 2/2001 |
| WO | 2011/100293 A2 | 8/2011 |

OTHER PUBLICATIONS

Written Opinion dated Nov. 7, 2018, from the ISA/European Patent Office, for International Patent Application No. PCT/EP2018/072776 (filed Aug. 23, 2018), 11 pages.

\* cited by examiner

METHOD AND APPARATUS FOR SURFACE PREPARATION PRIOR TO EPITAXIAL DEPOSITION

FIELD OF THE INVENTION

The present invention relates to a dielectric vessel and its associated components, and a plasma-based and surface reconstruction process performed within the dielectric vessel for a surface preparation of wafers (unpatterned or patterned), prior to hetero- or homo-epitaxial deposition of a semiconducting material. Such epitaxy may be for either non-critical areas of a transistor or for critical areas such as the channels. The process utilizes hydrogen atoms produced in the plasma to etch native oxide and remove contaminants such as oxygen, carbon, and amorphous silicon without damaging the wafer surface so that the wafer has a high quality crystalline surface (composed of silicon or III-V layers), ready for a high-quality epitaxy of III-V or other semiconducting materials.

BACKGROUND

U.S. Pat. No. 8,152,918 to Zhang et al. describes a pre-epitaxial deposition cleaning process in which an unspecified type of radio frequency (RF) excited plasma is formed from an unspecified etching gas to remove the native oxide or contaminant on the surface. No gas pressure or power density or mode of coupling of RF power appears to be suggested.

U.S. Pat. No. 5,252,181 to Dutartre et al. describes a cleaning method which uses an argon plasma with ion energies from 20 eV to 100 eV to sputter off the native oxide (~50 A) and then a hydrogen plasma with very low ion energies to remove the silicon damaged by the argon ion bombardment.

U.S. Pat. No. 6,995,077 to Siebert et al. describes a pure thermal native oxide removal process using hydrogen gas and provides removal of the oxygen and avoidance of surface defects in the silicon wafer. No plasma is used so temperatures above about 1000° C. are required.

U.S. Pat. No. 6,811,448 to Paton et al. discloses a process for cleaning prior to metal deposition for forming silicide. The process utilizes hydrogen gas plasma—capacitively coupled—at a power level of about 500 W with a gas pressure of 100 Pa of $H_2$ and argon mixture at a flow of 100 SCCM. Paton does not describe or specify the crystalline state or the level of contamination of the surface that is achieved after the cleaning process.

U.S. Pat. No. 8,501,629 to Tang et al. discloses a remote plasma etch of a patterned wafer surface. The remote plasma etch does not appeared to be performed before an epitaxy process, nor appears to be concerned with the crystallinity of the surface after the etching. Plasma is fed using a hydrogen-fluorine gas mixture mainly containing $NF_3$ gas and $NH_3$ gas, as well as hydrogen. The reaction mechanism is divided in two steps. First, a reaction step is performed where an adduct is formed from a reaction of native oxide, $NF_3$ and $NH_3$ in plasma, and then a sublimation step is performed where the adduct is evaporated at an elevated temperature.

U.S. Pat. No. 7,053,002 to Cohen et al. discloses a pre-clean process prior to metallization of the wafer surface for interconnects or contacts. A gas mixture including hydrogen, helium and argon is fed to a chamber using both an inductively coupled plasma source and a lower power RF bias applied to the wafer support. The inventors note that this process of Cohen produces a clean but damaged surface (due to argon ion bombardment) which is not suitable for the ensuing growth of a low-defect epitaxial film, and will also result in the removal of some of the substrate material.

U.S. Pat. No. 6,776,170 to Liu discloses an electrostatically shielded, inductively coupled plasma source using hydrogen gas to remove native oxide from wafer surfaces. The principal stated process application is surface cleaning in contact areas prior to deposition of cobalt and formation of cobalt silicide. The use of this method avoids several problems that occur with previous methods, such as the erosion of the silicon and deep crystalline defects due to ion damage. In Liu, the chamber is configured to inject gas from the top central opening of the plasma vessel. Further, the walls of the vacuum chamber within the coils are made of a non-conductive material, which is required for magnetic field penetration. Finally, the pre-clean process is performed for a pre-determined time which, for the application of Liu, is adequate to remove the contaminants from the wafer surface. The inventors note that the defect level capability of Liu's method may be $1\times10^{11}$ to $1\times10^{12}$ defects per $cm^2$ which is adequate for Liu's application. However, this defect level is far too high as a method for surface preparation prior to hetero-epitaxy, particularly in ultra-sensitive areas of the transistor such as the channels.

U.S. Pat. No. 5,903,106 to Young et al. describes an electrostatically shielded inductive plasma source having dielectric liners adjacent the plasma. Such liners may be made from quartz and high-purity ceramic. The inventors note that such liner materials, which typically may include aluminum oxide, can be sources of oxygen and, potentially, metallic impurities that can enter the gas phase in the plasma source.

US 2014/0011339 to Zheng et al. discloses a hydrogen-based cleaning process for removing oxygen from oxides on the wafer surface material—which may contain germanium or a III-V material. Hydrogen is dissociated in a chamber separate from the wafer and the atomic hydrogen is flowed to a separate chamber holding the wafer. The pedestal supporting the wafer receives a relatively low power RF bias (50 W to 150 W) and the gas pressure in the process chamber is around 100 mTorr. The inventors note that ion bombardment of the wafer at substantial energies may occur and damage the near-surface layers of the wafer surface material—germanium or III-V material. Following this cleaning, a silicide contact or gate dielectric/gate electrode may be deposited upon the surface, but epitaxial deposition upon the surface does not appear to be mentioned. The crystallinity of the surface after the cleaning process also does not appear to be considered.

Up to the present (10 nm node currently being introduced into leading edge wafer fabrication facilities), applications for hetero-epitaxy on patterned wafers in semiconductor manufacturing have involved deposition in contact (source/drain re-growth) areas, and not in the channels of the transistors. In contacts, the deposited epitaxial layer, whether Ge or other material, may have defects without compromising the function of the contact. Surface reconstruction in this case is not needed since defects in the deposited layer are not important. Successful homo-and hetero-epitaxy has also been performed routinely on bare wafers prior to patterning. However, future applications of hetero-epitaxy—such as III-V on silicon on patterned wafers—will deposit the hetero-epitaxial layer in the channels where it must be defect-free in order to have optimal transconductance and avoid undesirable side effects.

Methods for pretreatment before epitaxy in the prior art, as shown above, either employ gaseous etching at high temperatures where no charged particles are used, or involve use of some kind of plasma generated reactive species to etch away the contaminants at lower wafer temperatures. Temperatures enabling gaseous etching are at least 900° C., which is needed to activate chemical reactions of etching gases with the contaminants on the surface, converting them to volatile species that are pumped away. Such methods usually can avoid contamination of the wafer coming from walls by maintaining ultra-clean chamber conditions. In most thermal cleaning applications, there is a maximum "thermal budget" for such treatment which means that process times must be kept short in a certain temperature range and that a maximum temperature must not be exceeded.

Effective cleaning of silicon wafers with hydrogen or other gases in preparation for blanket hetero-epitaxial growth of crystalline materials on bare wafers is routinely performed using high temperature (>900° C.) gaseous wafer treatments. However, such a high temperature may not be within the thermal budget for wafers once patterning for transistor fabrication has begun. Chemical and mechanical effects on existing wafer patterns due to high temperature (>900° C.) with long bake time can cause problems in semiconductor devices such as: 1) loss of shallow implantation dopant of source/drain areas, 2) damage to patterned wafers with trenches for epitaxial growth; and 3) variations of critical device dimensions due to use of $H_2$ bake in conjunction with HF clean. At lower temperatures (<850° C.), the amount of process time for thermal contaminant removal is excessive, because rates drop exponentially with temperature. Such thermal/chemical cleans also may not remove surface contamination entirely, but usually yield an adequately crystalline surface upon which to grow succeeding epitaxial layers. The benefit of high temperature cleaning is that it simultaneously promotes re-crystallization of silicon atoms that may not have been properly incorporated into the crystalline structure after contamination is removed.

Plasma-based pretreatment typically has wafer temperatures much lower than thermal pretreatment, typically less than 600° C. The plasma serves to activate species or form reactive radicals—either by dissociation or gas phase reactions. Pre-clean processing using plasma to generate reactive species for contaminant removal has been done with various different plasma configurations. Several prior art patents use plasma within the process chamber for reactive species generation using various methods for plasma production including capacitive coupling of power in the RF band, inductive coupling, or electromagnetic coupling in UHF or microwave bands.

Processes with plasma to activate the gaseous species that chemically react with contaminants are commonly used for CVD chambers, and for wafers prior to metallization, and even some homo-epitaxial deposition processes. However, such cleaning processes usually leave unacceptable amounts of surface contaminants ($\gg 1 \times 10^{10}/cm^2$), caused by sputtering or release of contaminants from chamber walls, and almost always have ion bombardment of the wafer at energies sufficient to cause dislocations of atoms from the crystal lattice. Such contaminant levels of oxygen will generally cause moderate to high defect densities in most epitaxy layers and other contaminants from the walls will worsen this situation. Because of the above problems, no direct plasma clean has yet succeeded in meeting all requirements at advanced technology nodes (critical dimensions less than about 10 nm) for cleaning and surface preparation prior to more sensitive epitaxy processes of semiconducting films. The defect level for a direct plasma clean in prior art technologies is too high, especially for hetero-epitaxy where a chemically different single-crystal layer is deposited upon the original material surface. Such layers have a "lattice mismatch" between the crystals of the surface layer and substrate, which makes it especially sensitive to contaminants.

Alternatively, in some prior art technologies, plasma may be formed in a different chamber, which is called remote plasma, to provide reactive species that etch the contaminants from the surface. In most cases where remote plasma is used, an additional source of activation energy is needed on the wafer surface to promote the reactions of the reactive species with the native oxide or other contaminants. Various process chemistries have been used for such pre-clean process, including fluorine-based and hydrogen-based gases, with many approaches using them in gas mixtures including inert gases as well as the reactive gases. Several of the proximate and remote plasma pre-clean systems have used hydrogen gas as the principal reactive species for removal of oxygen and reduction of native oxides on the wafer surface.

A pre-clean process using "downstream" plasma-based gas activation, where separate chambers support the plasma used to generate reactive species, avoids the problem of sputtering and crystal damage in the process chamber, and may reduce the amount of contaminants released from the walls. However, contaminants that may be sputtered or desorbed from the walls of the plasma chamber can be entrained with the activated gas flowing into the process chamber resulting in wafer contamination. Further, such pre-clean processes typically are slow and usually fail to completely remove carbon and oxygen contaminants from the wafer unless there is an additional source of activation energy for surface reactions on the wafer. This activation energy is essential to promote reactions of radicals with the surface oxide or other species, to remove reaction products of the etchant species and the surface contaminants, and to reduce processing time. Typically, a "soft" plasma is employed in the process chamber to provide activation energy in the form of soft ion bombardment, UV or electron bombardment. However, it is very difficult to sustain a plasma, whether using RF or DC, where the plasma potential is so low that no ion damage or sputtering occurs. UV radiation is one possible clean source of activation energy, but there has been no commercial technology utilizing it, and other data (U.S. Pat. No. 7,053,002) shows that it may require very high energy photons (e.g., VUV, such as from helium excitation) to give substantial etching or cleaning rates, which is difficult to provide from an external radiation source.

Chambers for reconstruction of the wafer's surface crystalline structure are generally thermal anneal chambers that are capable of temperatures of at least 1000° C. These anneal chambers need to be incorporated into the processing system—typically by having the anneal chamber be connected to a central handling system so that wafers coming from the pre-clean chambers can be promptly reconstructed in the anneal chamber, before being moved in a non-contaminating environment to an epitaxial growth chamber where a thin film is grown on the surface of the wafers. However, for patterned wafers this temperature is much too high and would cause damage to the pattern for transistors on the wafer, as is described above.

None of the prior art cleaning apparatus and methods, given the constraints of temperature and processing time, cleans a wafer surface and preserves surface crystallinity sufficiently well for epitaxial deposition of films of extremely low defect density. Non-plasma methods such as Siebert ('077) require temperatures much greater than 1000° C. to have a process time less than hours, but patterned wafers cannot tolerate temperatures over 850° C. Other prior art methods and apparatus employing plasma to produce activated hydrogen species such as Hydrogen atoms have had deficiencies: causing crystalline damage to the critical surface layers of the wafer; permitting contaminants from the walls to get onto the wafer where they leave defects; removing too much of the wafer surface material; and leaving too many defects on the wafer surface to permit the growth of highest quality epitaxial films.

SUMMARY OF THE INVENTION

In accordance with one embodiment of the invention, during a pre-clean process, a semiconductor wafer is disposed in a dielectric vessel within a metal enclosure, and an inductively coupled plasma (formed in a plasma volume of the dielectric vessel) that comprises hydrogen is used to remove contaminants (e.g., oxygen, carbon) from a surface of the semiconductor wafer. Reactive species from the plasma bind to contaminants on the surface of the semiconductor wafer, forming volatile compounds which are desorbed from the wafer surface, exhausted from the dielectric vessel into an exhaust manifold, and then evacuated from the exhaust manifold. One or more of the following techniques and devices are used to achieve a low defect concentration on the surface of the semiconductor wafer of $\leq 5 \times 10^9$ per $cm^2$.

In accordance with some embodiments of the invention, hydrogen gas may be injected into the plasma volume via an injector nozzle which extends from the top of the dielectric vessel at least a third of a distance separating the top of the vessel from the surface of the semiconductor wafer. In an alternative embodiment, a mixture of hydrogen and a fluorinated gas such as nitrogen tri-fluoride may be injected. The injection of the hydrogen gas closer to the surface of the semiconductor wafer (generally less than about half the radius of the dielectric vessel) results in a higher radially outward velocity of the gas just above the surface of the wafer, as compared to when the injector is located more than half the chamber radius from the wafer surface. In embodiments where the gas is injected closer to the wafer rather than directly from a central gas inlet further from the wafer surface, the resulting effect is an increased transport of volatile compounds and other contaminants out of the dielectric vessel, and a reduction in the re-deposition of contaminants onto the surface of the semiconductor wafer. This elongated injector nozzle reduces the time needed for processing and in some cases improves the level of cleanliness of the wafer at the conclusion of the process.

In some embodiments of the invention, the dielectric vessel may have a short profile (e.g., height of dielectric vessel being less than or approximately equal to half of the radius of the dielectric vessel). The effect on the flow velocity field of the short profile is similar to the effect of the elongated injector nozzle, in that the gas just above the wafer surface may have a higher radial velocity (as compared to gas injected into a dielectric vessel with a tall profile).

In accordance with one embodiment of the invention, protective surface layers of materials that are inert to the reactive species from the plasma line the inner dielectric walls (i.e., the inner walls of the dielectric vessel). Such surface material layers may take the form of physical liners, or coatings thereupon, that may be disposed near inner surfaces of the dielectric vessel, or as coatings on the inner vessel wall. In some preferred embodiments, the protective surface or layers of material may be in the form of liners of thin sheet material made from crystalline silicon or polysilicon. Such liners may be about 1 mm or more in thickness and should be close to the dielectric walls, but do not need to be attached to the walls and may be free-standing. In other embodiments, the protective layers may consist of coatings on the inner wall of the dielectric vessel or coatings on separate non-conducting structures mounted inside the dielectric vessel near the walls, where such coatings may be of $Y_2O_3$ (densified yttria), $La_2Zr_2O_7$ (lanthanum zirconate), titanium nitride, tantalum nitride or aluminum nitride, all of which are chemically very stable against reduction by atomic hydrogen. Such protective surface materials help prevent contaminants (which form as a result of reduction by atomic hydrogen) from being released from the dielectric vessel and diffusing through the gas to the surface of the semiconductor wafer.

In accordance with one embodiment of the invention, an exhaust restriction, formed by an exhaust restrictor, may prevent plasma from forming in the exhaust manifold and may further prevent volatile compounds and other chemical compounds containing contaminants from diffusing from the exhaust manifold back into the dielectric vessel. The exhaust restrictor is preferably made of a material such as silicon that will not introduce contaminants into the dielectric vessel, or may be made of dielectric materials that are coated with inert coatings such as the protective surfaces on or near the inner walls of the dielectric vessel.

In accordance with some embodiments of the invention, a residual gas analyzer (RGA) may be used to measure the levels of contaminant chemical species in the plasma volume. A sampling port of the RGA may be located on a wall of the dielectric vessel, in which case the level of contaminants in the process gas within the dielectric vessel is directly measured, or the sampling port of the RGA may be located in the exhaust manifold, in which case the level of contaminants in the gases just exhausted from the dielectric vessel is measured. The RGA may measure the level of contaminants prior to the start of the pre-clean process (i.e., only start the pre-clean process upon the level of contaminants being below an acceptable level). The level of contaminants measured by the RGA may also be used to determine when to terminate the pre-clean process (i.e., end the pre-clean process upon the level of contaminants being below an acceptable level). Such an RGA should, in preferred embodiments, have high sensitivity and be capable of measuring contaminant partial pressures well below $10^{-6}$ Pascals.

In some embodiments, a wafer may be heated to about 850° C. within the same dielectric vessel in which the pre-clean process is performed in order to cause the surface crystallinity of the wafer to be re-constructed. The wafer may be heated in the absence of plasma either by lamps or by proximity with a heated support pedestal, and in some embodiments the plasma may be operated while the re-construction is taking place and the heating of the wafer by the plasma provides part of the power needed to raise the wafer temperature to the requisite temperature. In some embodiments, the energy for re-construction of the surface crystallinity may come from the bombardment of the surface by ions from the plasma. The energy of ion bombardment, however, should not exceed the threshold for dislocation formation for atoms of the crystal. For silicon, such threshold is approximately 15 eV for ionic species such as oxygen or fluorine, while for some compound semiconductor materials, the threshold may be as high as 25 eV.

These and other embodiments of the invention are more fully described in association with the drawings below.

DETAILED DESCRIPTION OF THE INVENTION

Figure 1:
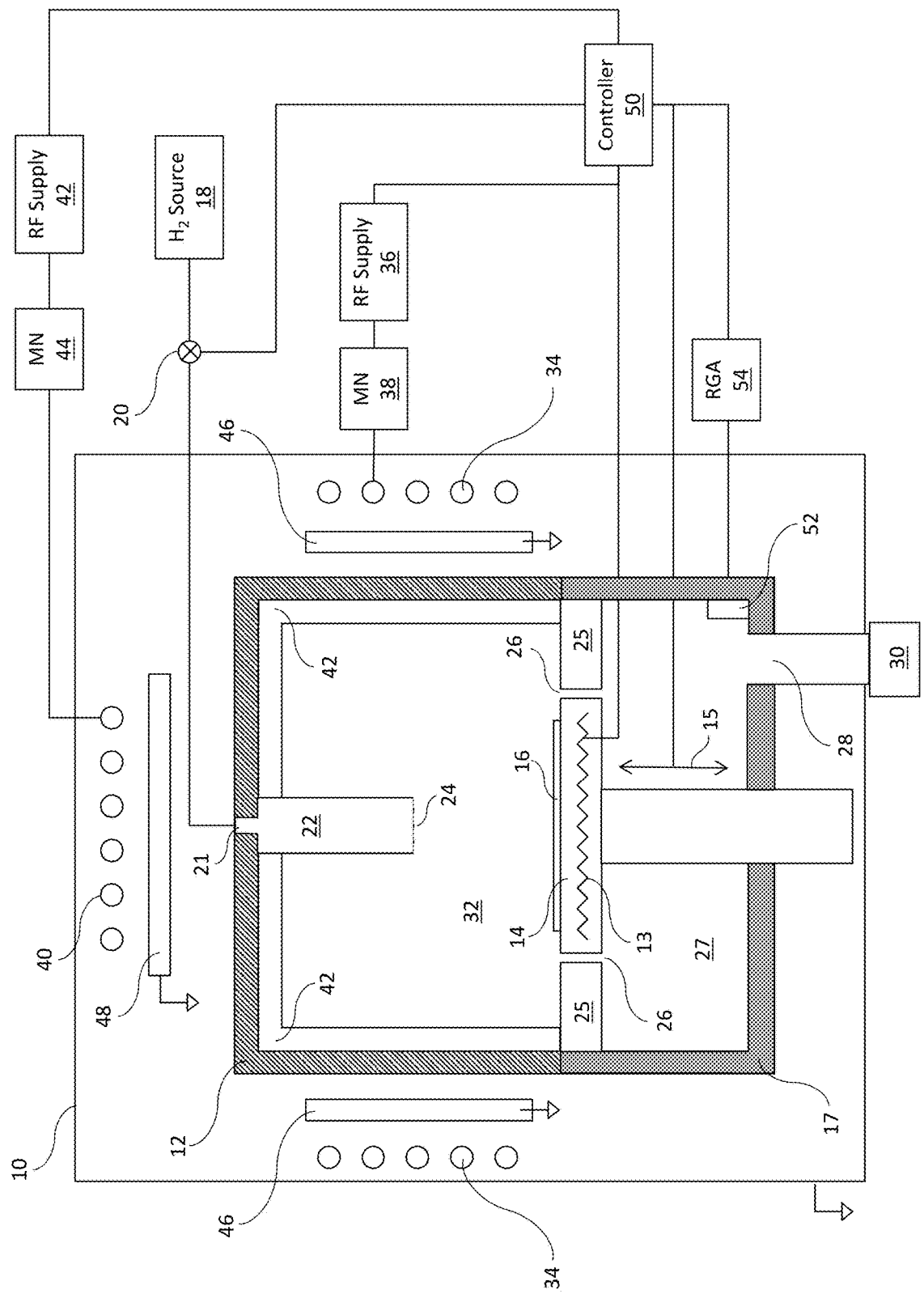
FIG. 1 depicts a cross-section of an apparatus for preparing a surface of a semiconductor wafer, as well as electrical control components and a hydrogen gas source, in accordance with one embodiment of the invention.

In the following detailed description of the preferred embodiments, reference is made to the accompanying drawings that form a part hereof, and in which are shown by way of illustration specific embodiments in which the invention may be practiced. It should be understood that other embodiments may be utilized and structural changes may be made without departing from the scope of the present invention. Description associated with any one of the figures may be applied to a different figure containing like or similar components/steps. While the sequence diagrams each present a series of steps in a certain order, the order of some of the steps may be changed.

There are two, independent functions of the pre-treat wafer process for semiconductor IC fabrication that may be completed prior to epitaxy, and especially hetero-epitaxy. If not already apparent, the "treat" in "pre-treat" refers to the subsequent epitaxy treatment. The first function, wafer surface cleaning (also called a pre-clean process), is a process step in which the contaminants on the surface are removed. The second function, re-construction of the wafer surface, involves wafer surface re-growth or modification to form multiple parallel crystal planes with "steps" between. Up to the present (10 nm node currently being introduced into leading edge fabrication systems), applications for hetero-epitaxy on patterned wafers in semiconductor manufacturing have involved deposition in contact (source/drain re-growth) areas, and not in the channels of the transistors. In contacts, the deposited epitaxial layer, whether Ge or other material, may have defects without compromising the function of the contact. Surface reconstruction in this case is not needed since defects in the deposited layer are not important. Successful homo- and hetero-epitaxy have also been performed routinely on bare wafers prior to patterning. However, future applications of hetero-epitaxy—such as III-V on silicon on patterned wafers—will deposit the hetero-epitaxial layer in the channels where it must be nearly defect-free in order to have optimal transconductance and avoid undesirable side effects. As such, both a near complete contaminant removal (commonly oxygen is the dominant contaminant) and surface reconstruction should be performed in a pre-treat wafer process.

In one embodiment of the invention, the wafer surface, required for performing near perfect hetero-epitaxy, must have less than about $5 \times 10^9$ defects per $cm^2$, and be monocrystalline, with the additional requirement that "steps" from any surface crystal plane to another be at least two atomic layers so that the epitaxial layers do not have dislocations at the steps. To do this, a pre-treatment process may evaporate or chemically convert to volatile species nearly all surface contaminants, and at the same time minimize the re-flux of contaminants to the wafer from the environment or walls of the dielectric vessel. "Reconstructing" the wafer surface to have monocrystalline planes with double atomic-layer steps is currently performed in a separate annealing chamber after the pre-cleaning in prior art technologies.

Processes and equipment for pre-clean in IC fabrication, currently used before epitaxy on unpatterned wafers or in source drain regions, are unacceptable for pre-clean of patterned wafers prior to epitaxy for channel regions of transistors. All prior art technologies known to the inventors appear to have one or more of the following deficiencies: they leave defects in the deposited layers, due to either chemical defects or physical defects at the surface of the wafer, involve wafer temperatures of 900° C. or higher, or remove too much of the substrate or surface layer material. Such new advanced applications as hetero-epitaxy for channels will probably begin with very high speed ultra-large scale integration (VLSI) logic integrated circuits (ICs), perhaps in the 7 nm node. Prior art technologies, for pre-clean systems and associated surface preparation and reconstruction methods described above and in other patents, fail to accomplish at least one of the following tasks required for wafer preparation in the production of advanced devices:

A nearly total removal of contaminants including oxygen, carbon, fluorine and weakly bonded silicon from wafer surface. The surface defect density after pre-clean must be less than about $5 \times 10^9$ defects per $cm^2$.

Minimizing contamination coming from the dielectric vessel walls to the wafer surface.

Minimizing gas recirculation within the plasma volume resulting in recycling of contaminants—making removal of contaminants more difficult from the plasma adjacent the wafer.

Minimizing contaminants back-diffusing from the exhaust manifold under the wafer pedestal.

Keeping wafer temperature below 850° C. to preserve the patterning on the wafer.

Leaving the surface with a crystalline surface having step-like transitions between planar regions.

Achieving short process times (5-10 minutes) and high productivity in a mass-production tool having reasonable cost, process repeatability, process transferability and high availability.

Prior art chambers and processes typically achieve some of the above requirements but fail at one or more of them. Only a pre-clean chamber and process succeeding at all of the above tasks is likely to be successful in semiconductor fabrication systems for hetero-epitaxy on patterned wafers for advanced (<10 nm) semiconductor devices.

Pre-clean chambers using inductively coupled plasma for pre-epitaxy surface preparation typically are larger in volume than pre-clean chambers using capacitively coupled plasmas, operate at lower gas pressures, and have gas injection either from an injection ring around the periphery of the chamber or from a central nozzle at the top of the pre-clean chamber (i.e., also called a plasma chamber or a plasma reactor). Typically, the walls of the plasma chamber are made from quartz or alumina ceramic (See U.S. Pat. No. 5,903,106), which can be a source of oxygen and other contaminants. Whereas in capacitive reactors where the gas flow pattern is set by a showerhead closely spaced to the wafer providing a strong radially outward gas flow pattern from the wafer center, this is not the case in larger inductive plasma chambers. See, e.g., U.S. Pat. No. 6,776,170 for an example of an inductive plasma chamber. Inductive plasma reactors typically operate at gas pressures less than about 5 Pascals and normally less than 2 Pascals. At pressures near the low end of this range, such plasma reactors with their large volumes provide only modest convective transport of contaminants to the chamber exhaust by the bulk gas flow within the plasma chamber. This convective transport of contaminants is further reduced when the majority gas is hydrogen, due to the low molecular mass of $H_2$ and the large mean free path of contaminants. As such, the contaminants must reach the exhaust in part via a diffusion process which is highly inefficient and tends to also allow the return of a substantial fraction of contaminants to the wafer. Diffusion, however, is much too slow for complete contaminant removal from the wafer in a commercially viable mass production factory. Another mechanism for contaminant flux to the wafer is the back-diffusion of species such as oxygen from the exhaust manifold where the spent process gases flow on their way to the vacuum line. Walls in the exhaust manifold may have substantial contaminant gases adsorbed on them or contained in the material that can be released into the gas phase in the presence of plasma or gas radicals. A third mechanism tending to reflux contaminants such as oxygen to the wafer—especially near its center—is the DC plasma potential which is typically most positive in the plasma near the central axis of the plasma chamber. Oxygen contaminants in the gas phase may form negative ions in this plasma and these ions are driven by DC electric fields toward the central axis because of their negative charge. The electrons are colder in the center and lower in density so the negative ions will typically have longer lifetimes there and fall down to the wafer center. This mechanism tends to recycle contaminant oxygen from walls of the plasma chamber to the wafer center where it is hardest to remove them. Prior art inductive reactors are not ideal with regard to contamination removal and reflux, and complete removal of contaminants from such reactors is not efficient.

Figure 12C:
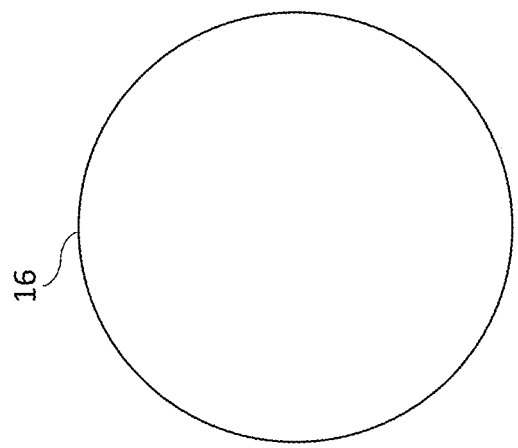
FIG. 12C depicts a schematic of a semiconductor wafer (representing the image from a diagnostic tool shining UV light) following the combined process including a pre-clean (in a chamber such as in the embodiment of FIG. 1 but without the protective liners) and hetero-epitaxial deposit of a III-V material.

Plasma in inductive reactors is typically denser than in capacitive reactors, and for pure inductive coupling (when using electrostatic shielding), energies of ions bombarding the walls are usually much lower. Nonetheless, like capacitive reactors, inductive plasma reactors operated with a reducing gas or mixture still will have a flux of contaminants from quartz or most dielectric wall materials into the plasma. When tests were performed by the inventors of such a gas injection configuration in a wafer pre-clean chamber (similar to FIG.1 of U.S. Pat. No. 6,776,170), many defects were present on the wafer surface, such that following hetero-epitaxy on a silicon wafer, there was a highly defective III-V layer across most of the wafer, resulting in a greenish tint in a UV fluorescent picture. FIG. 12A depicts a schematic illustrating the highly defective III-V layer (shaded region 56) on the surface of substrate 16.

For applications where near complete removal of the contaminants from the wafer is essential, such as hetero-epitaxy for critical transistor areas, there may be variations in the thickness of the contaminant (e.g., native oxides) on the wafer, or variations over time in the amount of oxygen or moisture on the walls of the dielectric vessel or exhaust manifold. In this case, wafer cleaning with a fixed, predetermined process time could be inefficient for some wafers (in which wafers having very little contaminants are needlessly processed for a long time), while for other wafers, an inadequate processing of other wafers (in which more contamination is present on the walls or wafer prior to pre-clean process) could cause failure of the process under some circumstances. Therefore, prior art inductive reactors for pre-epitaxial cleaning are not generally able to provide the extremely low surface concentration of contaminants and dislocation-free wafer surface needed for highest quality epitaxy, whether hetero-epitaxy or homo-epitaxy.

The inventors are not aware of any plasma-based chambers in the prior art that are designed, or are capable of performing a thermal treatment that accomplishes reconstruction of the wafer's crystalline surface. Chambers, such as those in the prior art, having plasma generating components are generally incapable of tolerating the very high temperature—typically between 800° C. and 850° C.—where annealing may be performed without damaging the patterned structures that later become parts of transistors.

According to one objective of the invention, a plasma-based, pre-epitaxy wafer pretreatment chamber and process should completely remove contaminant species from the wafer surface, reduce the concentration of defect/pitting sites on the wafer, and in some embodiments, include an anneal that leaves the exposed surface as crystal planes parallel to the wafer surface with linear steps. The objectives of the invention more particularly include one or more of:

Providing a hydrogen containing plasma with uniform density over the wafer surface that also provides efficient formation of large amounts of reactive Hydrogen atoms and may additionally provide He or F atoms.

Minimizing contaminant flux to wafer from the chamber walls by controlling ion energy to walls and wall or liner materials.

Avoiding back diffusion of contaminants from the walls of the pumping manifold into the plasma region above the wafer.

Bringing into the gas phase of elements such as oxygen and carbon by chemical reactions of atomic hydrogen with native oxides, of oxygen and of other contaminants on the wafer surface, leaving less than $5\times10^9$ defects/cm$^2$ on the wafer surface.

Efficient removal of gaseous contaminants from the volume over the wafer by entrainment in bulk gas flow through the dielectric vessel into the exhaust manifold.

Injecting the process gas such that recirculation flows in the plasma volume are avoided.

Causing no defects in the crystal of the wafer's surface layer due to ion bombardment by keeping the energy of ions bombarding the wafer below the damage or sputter thresholds.

Detecting when the contaminant elements have been almost entirely removed from the exhausted process gas.

Annealing the wafer to reconstruct wafer surface with stepped planes, keeping wafer temperature below about 850° C.

Minimizing etching of substrate material so less than 1 nm of crystalline material is etched from an exposed layer of the wafer.

Enabling high productivity in a mass-production hetero-epitaxy tool having reasonable cost, process repeatability, process transferability and high availability.

The pre-clean process should remove the oxygen (native oxide) and other contaminant species from the wafer, virtually completely, and avoid causing non-etchable contaminants from walls or exhaust manifold from contacting the wafer. To do this, the process may convert contaminant elements to volatile compounds on the wafer surface by a radical-based chemical etching process, typically with atomic hydrogen or fluorine atoms. Reaction products may be desorbed from the wafer by energetic species such as UV photons or ions that strike the surface—both of which are provided in large amounts by plasma containing hydrogen. Such ions should have sufficient energy to desorb reaction products but not to cause crystal damage or sputtering. Once desorbed, reaction products may be removed from the dielectric vessel both by bulk gas flow and diffusion. The energy of ions hitting the walls is roughly equal to the difference between the plasma potential and the wall potential, while the energy hitting the wafer is mainly dependent on the plasma potential. Ions hitting the wafer should be below the energy thresholds for creating defects in the crystal which depends on the type of ions and the crystal composition. For silicon crystals, ion energies over 20 eV for O+ or other heavy ions can cause dislocations while energies over 120 eV are required for H+ ions. The main concern with ions hitting the walls is that they promote chemical etching or sputtering of contaminants which then get onto the wafer. Typically, heavier ions need only have energies above about 20 eV to cause sputtering and even below this they can cause chemical etching.

The wall material should not be a source of contaminants, and should not contain metal which can become a source of metal contaminants by sputtering. Further, as much as possible, the wall material should be resistant to etching by atomic hydrogen and fluorine.

The process time should be sufficient to completely remove contaminants and defects from the wafer surface crystal such that every wafer meets the cleanliness requirements for a near perfect hetero-epitaxial film growth. This time may vary substantially from wafer to wafer, during the course of cleaning a large number of wafers in a mass production setting. This process time should also include, as a safety margin, an additional modest over-etch time beyond the time when a pre-determined low level of contaminant is reached in the exhaust. Yet, the process time should not be excessive and wasted, since it is essential for the commercial competitiveness of such an expensive processing system that as many wafers be processed per hour as possible.

If possible, this pre-treat process should, in addition to chemical contaminants, also eliminate non-crystalline-bonded atoms of the wafer's surface layer material, or reconstruct the surface layer, leaving a crystalline surface with planar/stepped structure across the entire wafer. This may in some embodiments be accomplished with a very selective etching process for "non-crystalline bonded" species. In the case of a silicon substrate, after removal of contaminant elements there may be silicon atoms on the surface that are weakly bonded, as in amorphous silicon. Such atoms may be more easily etched from the surface than atoms that are fully bonded into the crystalline structure. For patterned wafers, where transistor fabrication has already been started, the near-perfect (i.e., less than $5\times10^9$ defects per cm$^2$) surface cleaning must include all areas within the pattern where the epitaxial layer is to be deposited, for every die across the entire wafer. Further, such a process must not remove too much of the substrate material (~1 nm or less), since that material will usually be needed for the device fabricated on the wafer. Ideally, the steps between planar areas should be at least two atomic layers to minimize the discontinuities between planar segments. The pre-treat process must enable defect-free hetero-and homo-epitaxial films to be grown across the entire wafer, or on desired areas for each device across the entire wafer.

The pre-treat process should enable defect-free hetero- and homo-epitaxial growth on a wide variety of substrates or surface layers (including crystalline silicon and III-V compound semiconductors). This cleaning and surface preparation should also be applicable to preparing the wafer surface that already has a thin surface crystalline layer, for growing an additional layer—such as an epitaxial layer on epitaxial layer such as InP on GaAs, or InGaAs on InP, or other. In this case, there must not be more than a few atomic monolayers of material loss of the underlayer during the pre-treat process that prepares the wafer for further epitaxial deposition.

FIG. 1 depicts a cross-section of an apparatus for preparing a surface of a semiconductor wafer, as well as control components and a hydrogen gas source, in accordance with one embodiment of the invention. The preparation of the surface may include the removal of contaminants (e.g., native oxide) using a hydrogen-containing plasma, as well as the restoration of surface crystallinity by annealing the wafer at temperatures between 750-850° C. Both of these steps may occur within the same process chamber.

Dielectric vessel 12 may be disposed in metal enclosure 10. Support pedestal 14 may be located adjacent to dielectric vessel 12, and may support substrate 16 (e.g., a semiconductor wafer). Support pedestal 14 may be connected to an alternating current (AC) ground, to minimize the AC voltage of support pedestal 14. A heater 13 (e.g., a resistive heater) may be present in support pedestal 14 for raising a temperature of substrate 16 to between 300° C. and 850° C. The temperature of heater 13 (and in turn the temperature of substrate 16) may be controlled by controller 50. Support pedestal 14 may be connected to a shaft 15 that is configured to raise or lower support pedestal 14. The operation of shaft 15 (and in turn the height of support pedestal 14) may be controlled by controller 50.

Valve 20 may control a flow of $H_2$ gas or mixture containing $H_2$ gas from gas source 18 into plasma volume 32, which may be formed within dielectric vessel 12 (also called a plasma chamber, a pre-clean chamber or a process chamber). Valve 20, in turn, may be controlled by controller 50, which may turn off or on the flow of $H_2$ or mixed gas. $H_2$ or mixed gas may flow through tubing (i.e., line connecting gas source(s) 18 and valve 20, and line connecting valve 20 to gas inlet 21 of dielectric vessel 12) into gas injector nozzle 22. Gas injector nozzle 22 may extend downwards from a top surface of dielectric vessel 12. In some embodiments, gas injector nozzle 22 may extend between ¼ and ¾ of a distance from the top surface of the dielectric vessel to support pedestal 14. In another embodiment, gas injector nozzle 22 may extend at least a third of a distance from the top surface of the dielectric vessel to support pedestal 14.

Gas outlets 24 may be disposed on a bottom surface of gas injector nozzle 22, through which the $H_2$ or mixed gas enters into plasma volume 32. The elongated form of gas injector nozzle 22 results in an increased radial flow velocity of the $H_2$ or mixed gas outwards from the center of plasma volume 32 at distance of between 5 mm to 10 mm from the surface of the wafer 16 (as compared to gas being injected into plasma volume 32 directly from gas inlet 21 of dielectric vessel 12). The flow of $H_2$ or mixed gas is further described below in FIGS. 2-7. Gas injector nozzle 22 may be made from silicon to prevent the nozzle from being a source of contaminants. It is noted that other gas sources in combination with the hydrogen gas source, such as a fluorine source, may be used during the pre-clean phase of the process, or, during the reconstruction phase. In some embodiments an alternative to the hydrogen gas source, such as a helium gas source (not depicted) may be used.

Induction coils 34 and 40 generate a magnetic field (when powered by an alternating current), which transforms the gas into a plasma within plasma volume 32 (i.e., dissociating $H_2$ gas into hydrogen atoms and ions, and other molecular gases into fragments that may contain H or F atoms and ions). Induction coil 34 may be helical in shape, while induction coil 40 may be in the form of a flat coil. While induction coils 34 and 40 are both present in the embodiment of FIG. 1, it is understood that it is possible to have induction coil 34 (and not induction coil 40) or induction coil 40 (and not induction coil 34) in other embodiments. Radio frequency (RF) power may be supplied from RF supply 36 via impedance matching network 38 to induction coil 34. It is understood that a terminal portion of induction coil 34 may be grounded (not depicted). Similarly, RF power may be supplied from RF supply 42 via impedance matching network 44 to induction coil 40. It is understood that a terminal portion of induction coil 40 may also be grounded (not depicted). Controller 50 may control RF supply 36 and/or RF supply 42, allowing controller 50 to activate/deactivate the generation of plasma within plasma volume 32. Metal enclosure 10 is used to prevent the magnetic field generated by induction coils 34 and 40 from reaching the environment surrounding metal enclosure 10. As such, metal enclosure 10 may be made from a conductive material and may be grounded.

Figure 8B:
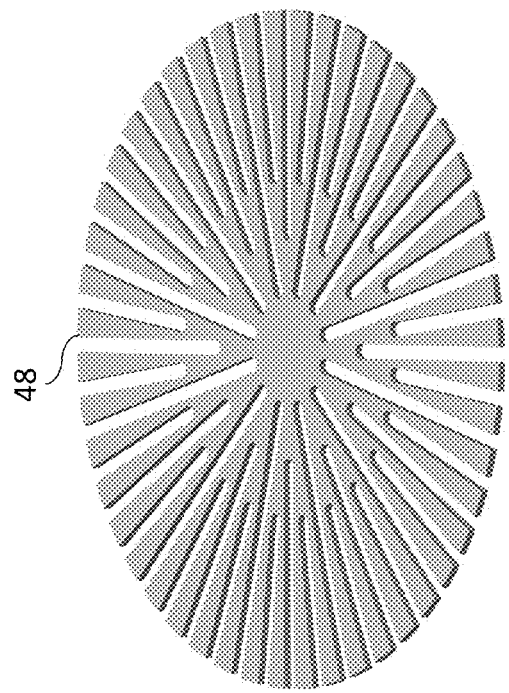
FIG. 8B depicts a perspective view of a disk-shaped slotted electrostatic shield, in accordance with some embodiments of the invention.
Figure 8A:
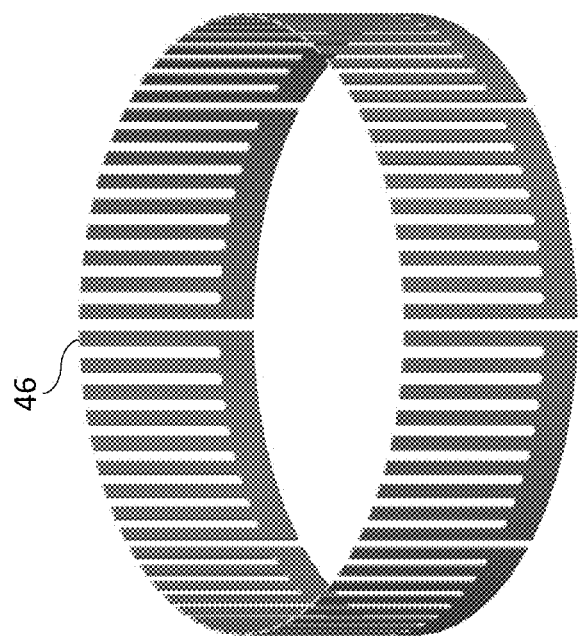
FIG. 8A depicts a perspective view of a cylindrical slotted electrostatic shield.

Metal electrostatic shields 46 and 48 substantially decrease the plasma potential and lower the energies of ions bombarding substrate 16 to avoid damaging the crystalline structure of substrate 16. Metal electrostatic shields 46 and 48 also decrease the ion energies bombarding dielectric vessel 12, reducing wall sputtering and etching reactions of the process gas with the walls of dielectric vessel 12 which likely would introduce contaminants into the gas phase and then contaminate the wafer. When dielectric vessel 12 is shaped as a cylinder, electrostatic shield 46 resembles an open-ended cylinder (See FIG. 8A) that approximately conforms to the cylindrical walls of dielectric vessel 12, while electrostatic shield 48 is disk shaped (See FIG. 8B) that approximately conforms to the circular top of dielectric vessel 12. Electrostatic shields 46 and 48 may be slotted in a direction perpendicular to the direction of current flow in coils 34 and 40, respectively, to allow the magnetic field to efficiently penetrate into plasma volume 32. As depicted, both electrostatic shields 46 and 48 are grounded.

Protective liner 42 may be disposed adjacent an inner surface of dielectric vessel 12 to substantially reduce the flux of energetic species to the dielectric walls, so that the flux of oxygen or other contaminants into the gas phase is greatly reduced. Protective liner 42 may be made of material(s) that do not release (or release very few) gaseous contaminants when subjected to plasma exposure, being highly resistant to sputtering or etching. In a preferred embodiment, protective liner 42 may be made from crystalline silicon or polysilicon, which etch very slowly in predominantly hydrogen-based plasmas. In another embodiment, protective liner 42 may be made from $Y_2O_3$ (densified yttria), $La_2Zr_2O_7$ (lanthanum zirconate), or aluminum nitride, which are chemically very stable against reduction or etching by atomic hydrogen. In one embodiment, protective liner 42 may be formed as a coating (e.g., a thin film) on the walls of dielectric vessel 12.

Figure 9B:
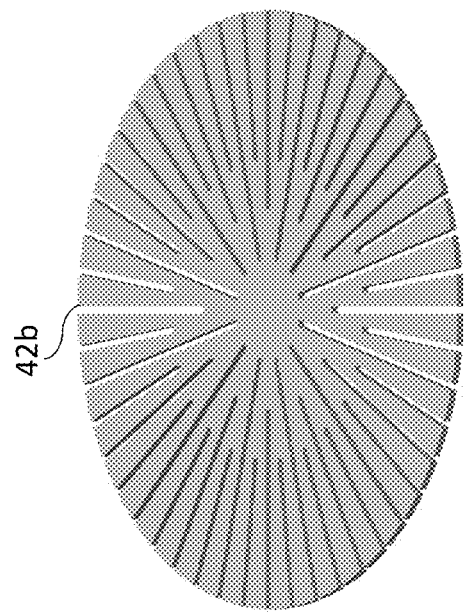
FIG. 9B depicts a perspective view of a top portion of the slotted protective liner, in accordance with some embodiments of the invention.
Figure 9A:
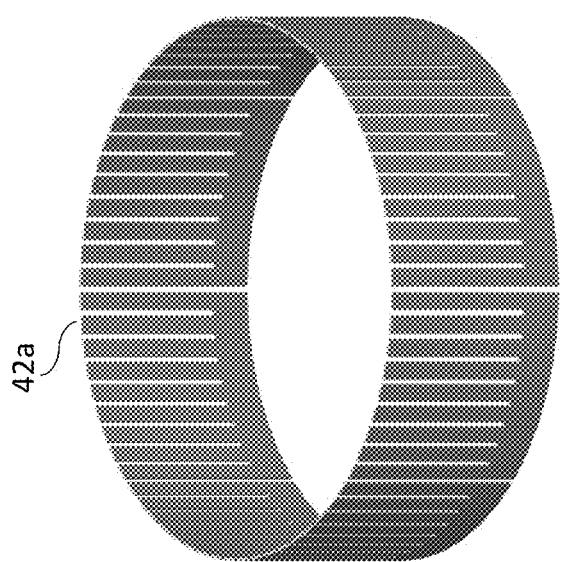
FIG. 9A depicts a perspective view of a side portion of a slotted protective liner.

As shown in FIGS. 9A and 9B, the protective liner (side portion 42a and top portion 42b thereof) may be slotted in a direction perpendicular to the direction of current flow to allow the magnetic field from the coils to efficiently penetrate into plasma volume 32. The slots are needed because the conductivity of the silicon (assuming the protective liners are made from silicon) above 300° C. allows induced countercurrents, which reduce the penetration of the magnetic field into plasma volume 32. The width of the slots of the protective liner 42 may be smaller than the width of the slots of the electrostatic shields 46, 48. Protective liner 42 may or may not be grounded, but should be located as close to the inner surface of dielectric vessel 12 as possible.

Figure 10B:
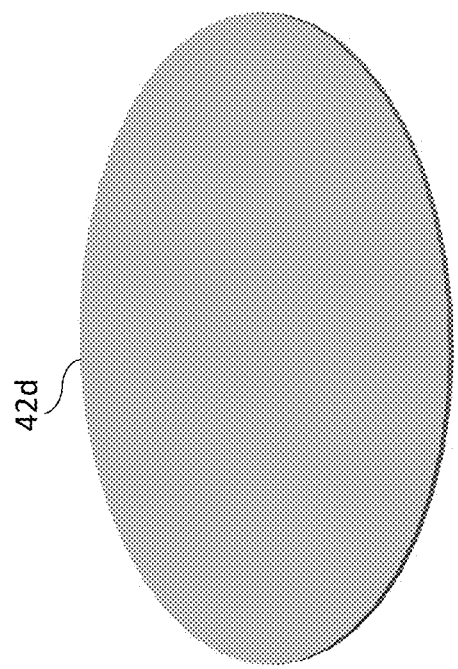
FIG. 10B depicts a perspective view of a top portion of a non-slotted protective liner, in accordance with some embodiments of the invention.
Figure 10A:
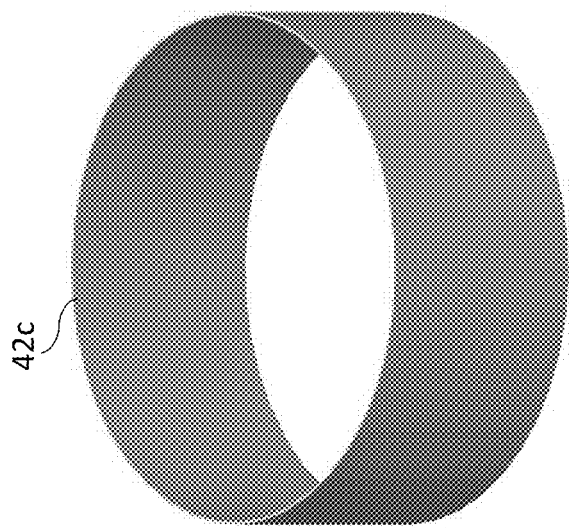
FIG. 10A depicts a perspective view of a side portion of a non-slotted protective liner.

Protective liner 42 is needed for all wall areas of dielectric vessel 12, but only the portions of the liner between the plasma excitation coils and the plasma needs to be slotted. For instance, if coil 34 were not present, the portion of protective liner 42 covering the side surfaces of dielectric vessel 12 could resemble the opened ended (non-slotted) cylinder 42*c* depicted in FIG. 10A. Similarly, if coil 40 were not present, the portion of protective liner 42 covering the ceiling of dielectric vessel 12 could resemble the (non-slotted) disk 42*d* depicted in FIG. 10B.

In the instance that protective liner 42 is grounded, it may serve as a protective liner and an electrostatic shield (making electrostatic shields 46 and 48 redundant), but in some circumstances, it may be advantageous to include both protective liner 42 and electrostatic shields 46 and 48.

After the hydrogen or other reactive species bind to contaminants on substrate 16 forming volatile compounds, these compounds may be evacuated into exhaust manifold 27 via exhaust restriction 26. Exhaust manifold 27 may be formed in the area beneath support pedestal 14 and within metal base portion 17. Pump 30 may facilitate the pumping of the exhaust gas out of exhaust manifold 27 and into vacuum pumping line 28. While two exhaust restrictions 26 are depicted in the cross section of FIG. 1, it is understood that exhaust restriction 26 may be a restricted opening that circumferentially surrounds support pedestal 14.

Exhaust restriction 26, created by exhaust restrictor 25, may prevent plasma from flowing into the exhaust manifold 27 and minimize the diffusion of exhaust gas (including volatile compounds and contaminants) from exhaust manifold 27 back into plasma volume 32. Exhaust restrictor 25, however, should not itself serve as a source of contaminants, and therefore in some embodiments is preferably made of a material such as silicon that will introduce very few contaminants into plasma volume 32 or is coated with inert materials such as those listed above as possible liner coatings.

Sampling port 52 of residual gas analyzer (RGA) 54 may be disposed in exhaust manifold 27 (as shown) or on a wall of dielectric vessel 12 (not depicted) to sample a concentration of contaminant (e.g., oxygen). RGA 54 may be used both prior to the pre-clean process and during the pre-clean process. Prior to loading the wafer onto the pedestal, RGA 54 may be used to monitor the level of chemical contaminants present in plasma volume 32. If the level of contaminants exceeds a first pre-determined level, an inert gas may be flowed into plasma volume 32 to exhaust the contaminants, or a hydrogen-containing plasma may be operated until the contaminant levels fall sufficiently. Upon the level of contaminants falling below the first pre-determined level, the wafer may be loaded and the pre-clean process may commence.

RGA 54 may also be used during the pre-clean process to determine when to terminate the pre-clean process (i.e., when to terminate the flow of process gas). When contaminants are being removed from substrate 16, the level of contaminants may initially be elevated. Eventually when most contaminants have been converted into volatile compounds and evacuated from plasma volume 32, the RGA will detect the level of chemical contaminants falling below a second pre-determined level. In some embodiments when the concentration of oxygen in the sampled gas falls below about 1 ppm, the level of chemical contaminants would be considered to be below the second pre-determined level. In response to such termination condition, the RF power to the excitation coils would be stopped and the flow of gas may be terminated. Following the pre-clean process, an anneal process or deposition of the epitaxial layer(s) may be performed. If not already apparent, the time for the pre-clean process may vary from wafer to wafer as it depends on the level of contaminants in the gas phase as the plasma pre-clean process is performed on wafers that may vary in contamination content. Wafers that have more contaminants may be cleaned for a longer period of time, whereas wafers that have less contaminants may be cleaned for a shorter period of time.

The desired plasma behavior and enhanced reaction of the reactive gaseous species may be achieved in some embodiments by operating the plasma source within certain ranges of gas pressure, RF power, gas flow and power duty cycle. The plasma source may include all of the components of FIG. 1, except for exhaust manifold 27 and other components below support pedestal 14. The pressure of plasma volume 32 may be maintained at pressures from about 1 mTorr to about 100 mTorr and preferably from about 3 mTorr to about 50 mTorr. The RF power supplied by RF supply 36 and/or 42 may be from about 20 Watts to 5,000 Watts, and preferably be in the range between about 200 Watts and 2,000 Watts. The flow of $H_2$ or mixed gas may be between about 10 SCCM and about 5,000 SCCM, and preferably be between about 100 SCCM and 2,000 SCCM. The dimensions of dielectric vessel 12 may depend on the substrate dimensions—from about 10% larger than the substrate diameter to about 67% larger. The effectiveness of the pre-clean process may be further optimized in some embodiments by modulating the RF power in the range between about 300 Hz to about 50 kHz, and with duty cycle greater than about 10%.

Following the pre-clean process, the surface of wafer 16 may be reconstructed within plasma volume 32 (although in the surface reconstruction step, plasma volume 32 may or may not contain plasma). The reconstruction of the surface may be facilitated by the removal of loosely bound atoms of the same element as the crystal from the surface of the substrate during the pre-clean process. Further in some embodiments, crystal reconstruction may be enhanced with plasma, in a "plasma-enhanced thermal anneal" process. Gas including at least one of Helium, $NF_3$, $F_2$ or $H_2$ may be flowed into plasma volume 32 during the reconstruction of the surface. Heater 13 may be located within the support pedestal 14 so that substrate 16 can reach a temperature that is adequate for surface reconstruction. Normally, such temperature would be about 850° C. The duration of this anneal process may be between about 1 minute and about 30 minutes. However, the presence of plasma in plasma volume 32 during the anneal step may lower the requisite temperature for the annealing of defects due to substrate heating by the plasma, and in some embodiments by the synergistic action of the ion bombardment from the plasma.

In some embodiments, heat from support pedestal 14 provides all the energy that is needed for crystalline reconstruction which may be performed in the same chamber (i.e., dielectric vessel 12) as the pre-clean process. Alternatively, a plasma may, in some embodiments, assist the heating provided by heater 13 by virtue of the heating it provides to substrate 16. Approximately 25% to 40% of the plasma power may be converted into heat for the substrate 16, which reduces the heating power required from heater 13. In one embodiment, heater 13 may provide enough heat to heat substrate 16 to about 750° C., and the plasma heating may provide the heat needed to raise the substrate from 750° C. to 820° C. In some embodiments, there is a further effect of the plasma, wherein the ion flux to the wafer may assist in the reconstruction of the crystalline surface by virtue of the activation energy it provides locally as each ion strikes the wafer. Upon striking the wafer, the ion energy is converted to phonons in the crystal which propagate outward from the point of impact on a picosecond time scale. Ion flux to the wafer may be of order 1 mA/cm$^2$ to 100 mA/cm$^2$, each ion providing about 10 eV of energy. This ion flux effectively provides up to an additional Watt per cm$^2$ of activation energy for the annealing process.

Figure 2:
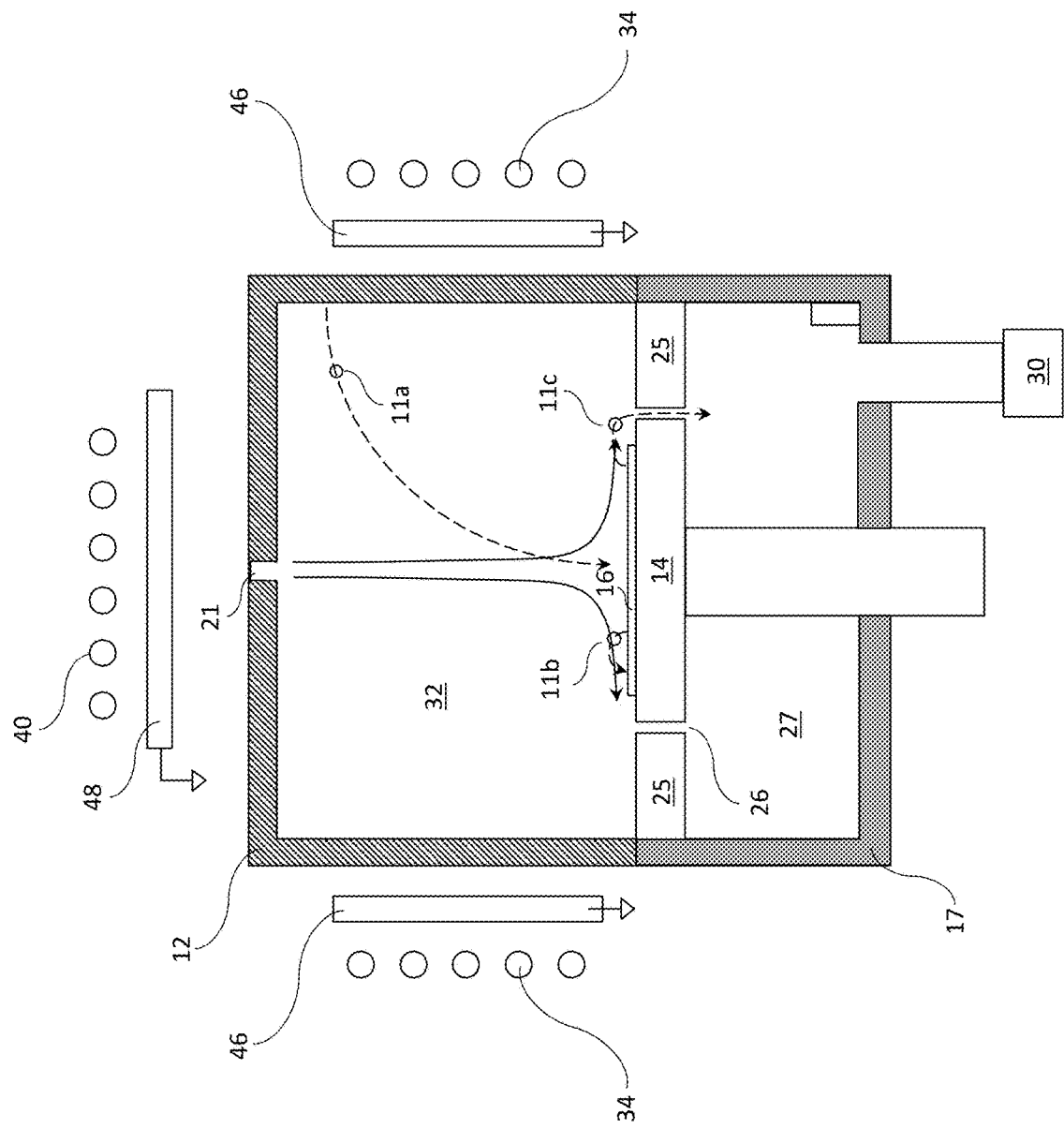
FIG. 2 depicts a cross-section of an apparatus for preparing a surface of a semiconductor wafer, in which contaminants accumulate on a central portion of the wafer surface.

FIG. 2 depicts a cross-section of an apparatus, to illustrate the challenges experienced without the inventive techniques described herein. The apparatus illustrated FIG. 2 does not contain protective liners. As such, contaminants (e.g., 11a) may be released from walls of dielectric vessel 12 and adsorb onto substrate 16. It is noted that even liners currently employed in the art (e.g., made from Alumina) may release contaminants (e.g., oxygen), which may adsorb onto substrate 16 in a similar manner. By injecting $H_2$ directly through gas inlet 21 into dielectric vessel 12 without gas injection nozzle 22 (and with a large vertical separation between gas inlet 21 and the surface of substrate 16), the radial velocity of the hydrogen-containing gas just above the wafer surface may be too weak to convect contaminants out of plasma volume 32 before they are re-deposited on the surface of substrate 16. To elaborate on why gas consisting mainly of $H_2$ has difficulty carrying contaminants out of plasma volume 32, the molecular weight of contaminants is often may times greater than the molecular weight of hydrogen, so it takes collisions with many hydrogen molecules to "push" contaminants to flow with the bulk flow towards exhaust manifold 27. It may be illustrative to use the analogy of a flock of ping-pong balls trying to carry along a bowling ball. It takes a lot of collisions to get the bowling ball to move with the flock of ping-pong balls in a certain direction. FIG. 2 illustrates that even some contaminants that are dislodged by the hydrogen plasma (e.g., contaminant 11b) may fall back onto the surface of substrate 16. On the other hand, some contaminants (e.g., 11c) particularly near the edge regions of substrate 16 are more likely to successfully be removed from substrate 16.

Figure 3:
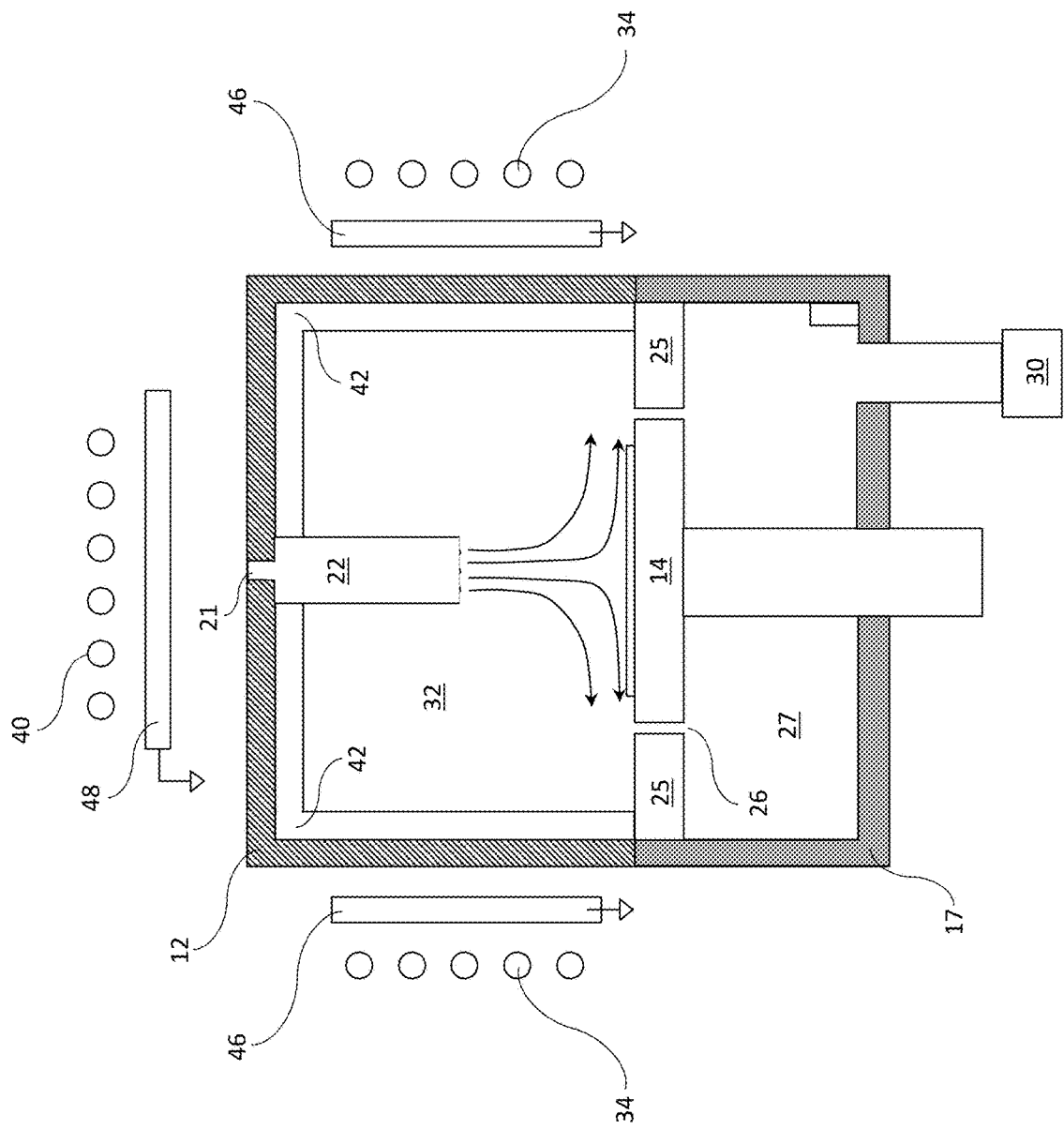
FIG. 3 depicts a cross-section of an apparatus for preparing a surface of a semiconductor wafer, the apparatus including an elongated gas injector and protective liners, in accordance with one embodiment of the invention.

FIG. 3 depicts a cross-section of an apparatus for preparing a surface of a semiconductor wafer, with elongated gas injector nozzle 22 and protective liners 42. In FIG. 3, details of the gas injection from gas injector nozzle 22 have been drawn in more detail, while other details of the apparatus have been omitted in the figure for clarity of presentation. As shown, the elongated gas injector increases the radial velocity of the gas at small distances above the wafer and especially near the wafer center. Further, with protective liner 42, the amount of contaminants released from walls of dielectric vessel 12 is substantially reduced so that as contaminants are removed from the area in the center of the wafer at achievable removal rates, the wafer may be completely cleaned of contaminants within a commercially acceptable process time.

Figure 4:
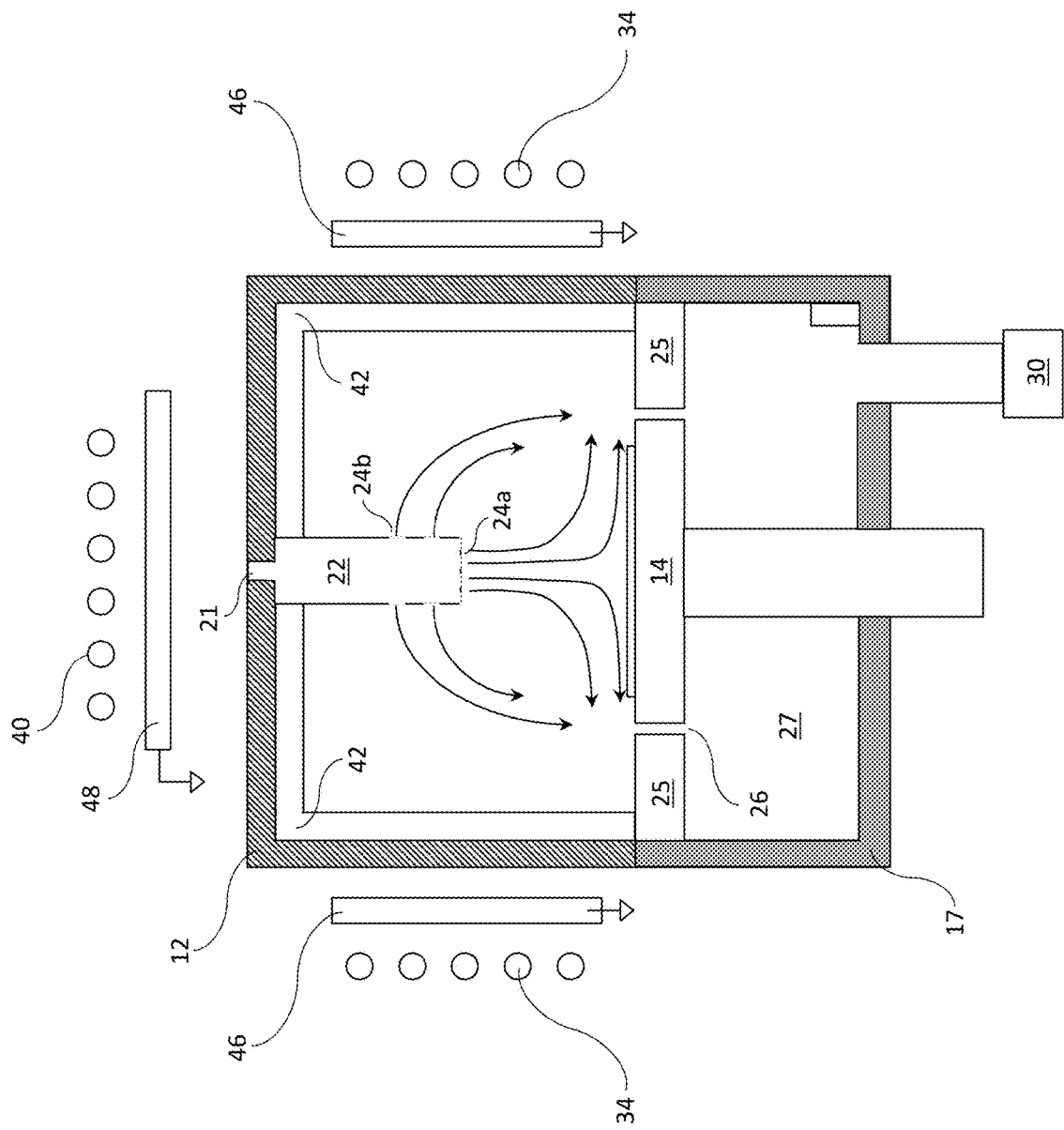
FIG. 4 depicts a cross-section of an apparatus for preparing a surface of a semiconductor wafer, with an elongated gas injector having side and bottom gas outlets, in accordance with some embodiments of the invention.

FIG. 4 depicts a cross-section of an apparatus for preparing a surface of a semiconductor wafer, with elongated gas injector nozzle 22 having bottom outlets 24a and side outlets 24b. The gas injected from side outlets 24b helps to reduce the recirculation of gas within plasma volume 32, increases the likelihood of contaminants being carried out of dielectric vessel 12, and decreases the likelihood of contaminants from walls being deposited (or re-deposited) onto substrate 16.

Figure 5:
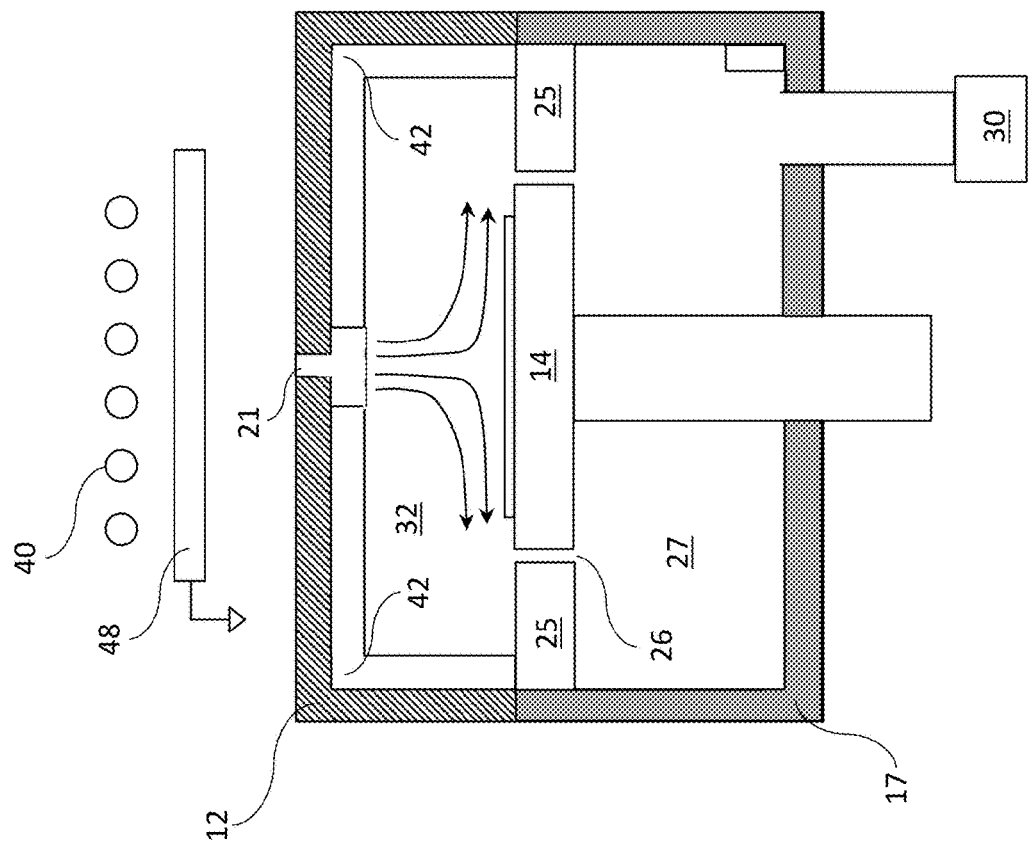
FIG. 5 depicts a cross-section of an apparatus for preparing a surface of a semiconductor wafer, the apparatus including a low dielectric vessel height, in accordance with one embodiment of the invention.

FIG. 5 depicts a cross-section of an apparatus for preparing a surface of a semiconductor wafer, with a small dielectric vessel height relative to a radius of the dielectric vessel. In one embodiment, the height of dielectric vessel 12 may be less than the radius of dielectric vessel 12. In a preferred embodiment, the height of dielectric vessel 12 may be less than half of the radius of dielectric vessel 12. Having a low dielectric vessel height is another way to reduce the vertical distance traveled by the hydrogen gas, and in turn increase the radial bulk gas flow velocity just above the wafer surface at small radii from the wafer center. A drawback of the low dielectric vessel height, however, is a less efficient plasma generation. A smaller plasma volume results in less efficient ionization by energetic electrons. It is possible that in an apparatus with a low dielectric vessel height, only flat coil 40 above dielectric vessel 12 may be present while helical coil 34 would be omitted, as helical coil 34 would be inefficient in coupling power into the plasma.

Figure 6:
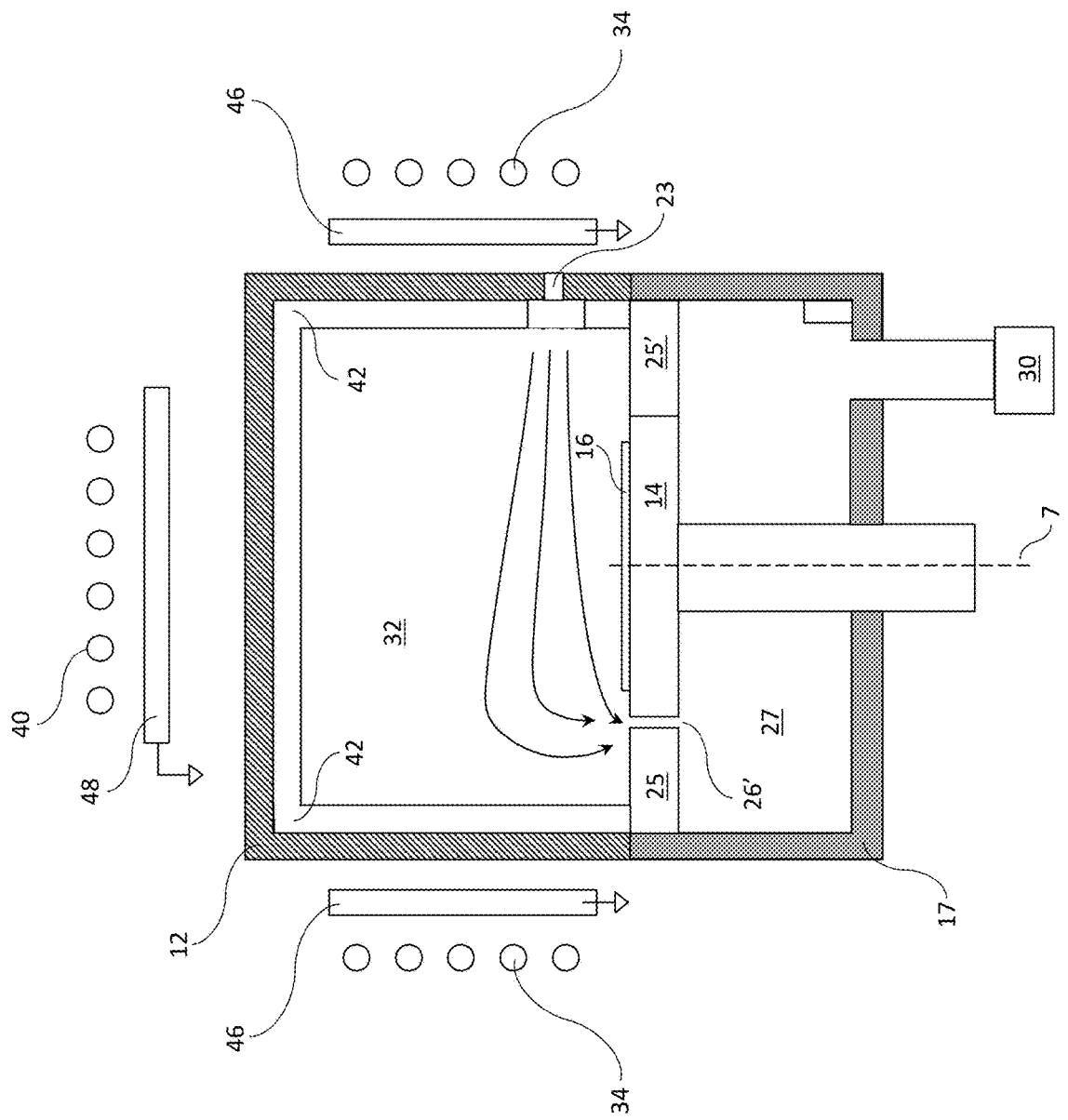
FIG. 6 depicts a cross-section of an apparatus for preparing a surface of a semiconductor wafer, in which hydrogen gas is injected from a gas inlet disposed on a wall of the dielectric vessel adjacent to a first side of a support pedestal and exhaust gas is evacuated from a gas outlet disposed adjacent to a second side of the support pedestal, in accordance with one embodiment of the invention.

FIG. 6 depicts a cross-section of an apparatus for preparing a surface of a semiconductor wafer, in which a mixed gas including hydrogen is injected from gas inlet 23 disposed on a wall of dielectric vessel 12 adjacent to a first side of wafer support pedestal 14 and exhaust gas is evacuated from exhaust restriction 26' disposed adjacent to a second side of the wafer support pedestal 14. While exhaust restriction 26 (e.g., in FIG. 1) is understood to be an opening that circumferentially surrounds wafer support pedestal 14, exhaust restriction 26' may be an opening that is present only at one side of wafer support pedestal 14, covering a limited range of azimuth as measured at the wafer center. As depicted, injected gas may flow substantially parallel to a surface of substrate 16, and the lateral flow of gas helps to carry away and exhaust any volatile compounds and contaminants that are released from the surface of wafer 16 and the walls of dielectric vessel 12. For increased uniformity in cleaning the surface of substrate 16, support pedestal 14 may be rotated about central axis 7. While exhaust restrictor 25' is depicted as abutting support pedestal 14, there may be a small gap that is present to allow support pedestal 14 to rotate freely about central axis 7.

Figure 7:
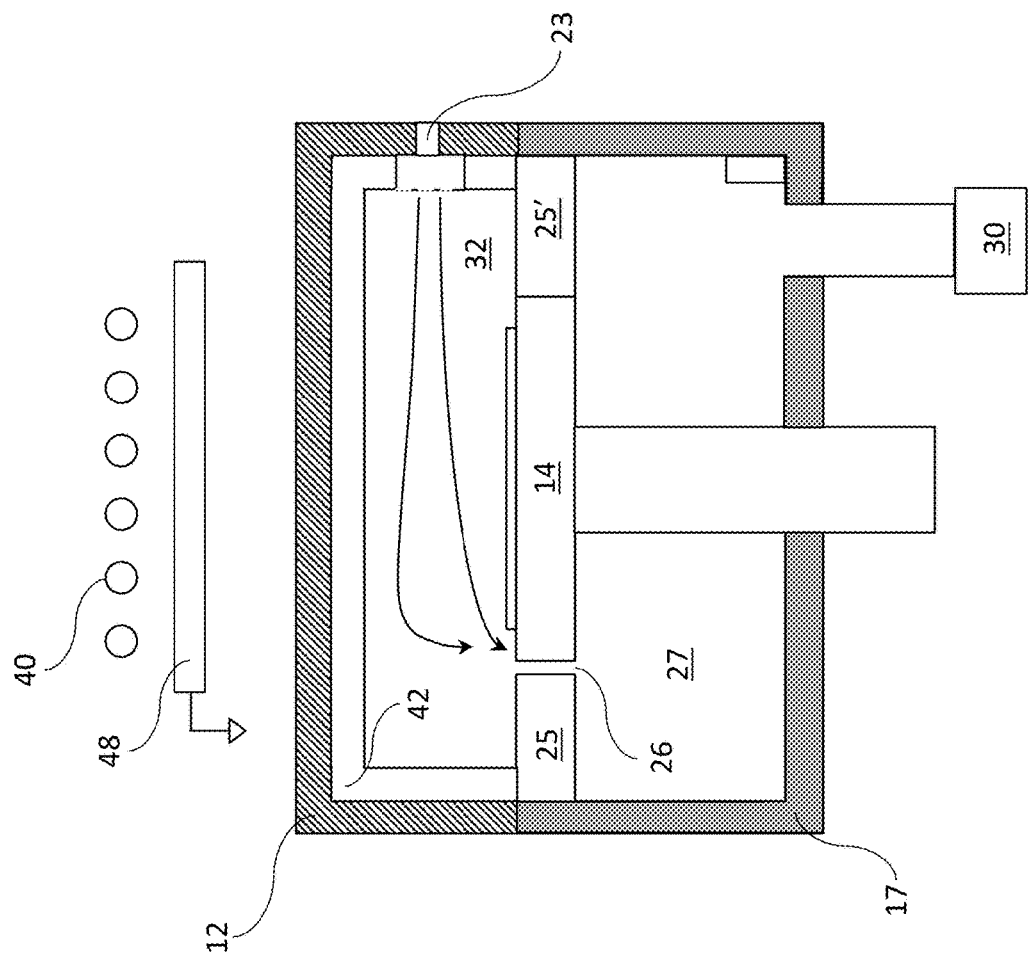
FIG. 7 depicts a cross-section of an apparatus similar to that depicted in FIG. 6, except with a low dielectric vessel height, in accordance with one embodiment of the invention.

FIG. 7 depicts a cross-section of an apparatus similar to the apparatus depicted in FIG. 6, except with the height of dielectric vessel 12 being reduced (i.e., with a small dielectric vessel height relative to a radius of the dielectric vessel). Such reduced height may help to reduce the recirculation of gas within dielectric vessel 12.

Figure 11B:
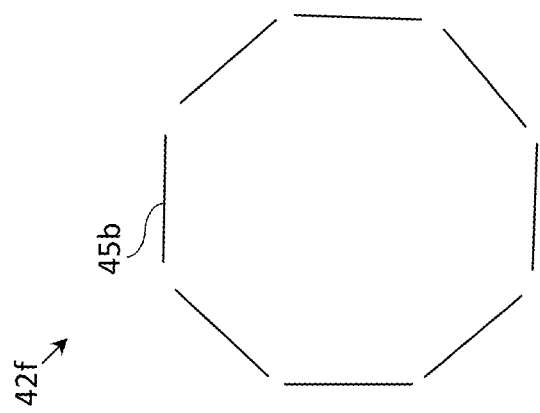
FIG. 11B depicts a top view of a protective liner formed by planar panels of liner material, in accordance with some embodiments of the invention.
Figure 11A:
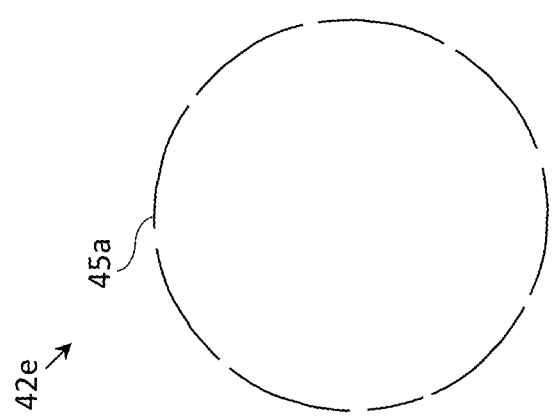
FIG. 11A depicts a top view of a protective liner formed by curved panels of liner material.

FIG. 11A depicts a top view of protective liner 42e formed by curved panels 45a of liner material, and FIG. 11B depicts a top view of a protective liner 42f formed by planar panels 45b of liner material, in accordance with some embodiments of the invention. Each of the curved panels 45a may be identical in shape and size (different than depicted). Each of the planar panels 45b may also be identical in shape and size.

FIG. 12A depicts a schematic of a semiconductor wafer (representing the image from a diagnostic tool shining UV light) following a combined process including: pre-clean in a chamber such as in the embodiment of FIG.1 of U.S. Pat. No. 6,776,170 and a hetero-epitaxial deposit of a III-V material. As shown in the schematic, there is a substantial area around the center of the wafer with a high defect density.

Figure 12B:
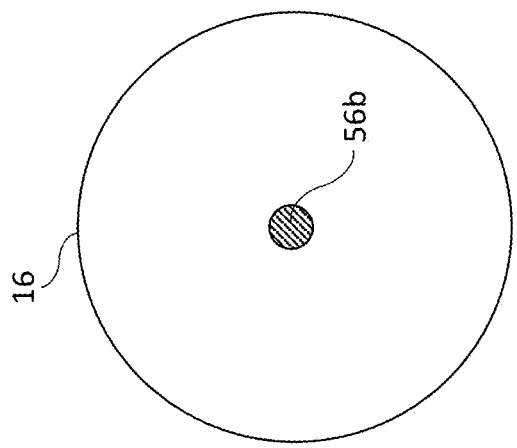
FIG. 12B depicts a schematic of a semiconductor wafer (representing the image from a diagnostic tool shining UV light) following the combined process including a pre-clean (in a chamber such as in the embodiment of FIG. 5 but without the protective liners) and hetero-epitaxial deposit of a III-V material.
Figure 12A:
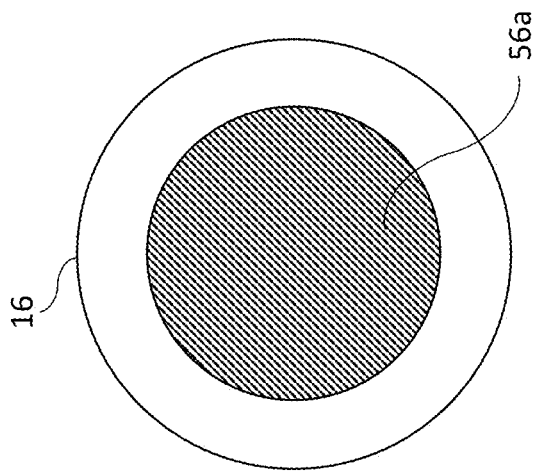
FIG. 12A depicts a schematic of a semiconductor wafer (representing the image from a diagnostic tool shining UV light) following a combined process including both pre-clean of a silicon wafer (in a chamber such as in the embodiment of FIG.1 of U.S. Pat. No. 6,776,170) and hetero-epitaxial deposit of a III-V material on the cleaned silicon wafer.

FIG. 12B depicts a schematic of a semiconductor wafer (representing the image from a diagnostic tool shining UV light) following a combined process including: pre-clean in a chamber such as in the embodiment of FIG. 5 (but without the protective liners) followed by a hetero-epitaxial deposit of a III-V material. As shown in the schematic, there is a small area (e.g., 5 cm in diameter) around the center of the wafer with a high defect density.

FIG. 12C depicts a schematic of a semiconductor wafer (representing the image from a diagnostic tool shining UV light) following a combined process including: pre-clean in a chamber such as in the embodiment of FIG. 1 (but without the protective liners) followed by a hetero-epitaxial deposit of a III-V material. As shown in the schematic, no area of the wafer had a high defect density, but examination by a scanning electron microscope (SEM) revealed point defects (approximately 10 defects per mm$^2$) near the center of the wafer.

Figure 13A:
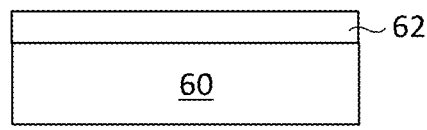
FIGS. 13A-E depicts cross-sections of a silicon wafer across various time points in the process of epitaxially growing a III-V layer on the surface of the silicon substrate, in accordance with some embodiments of the invention.
Figure 13B:
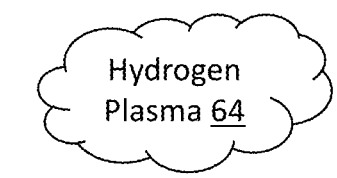
Figure 13C:
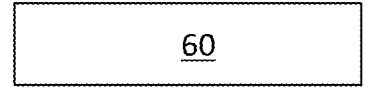
Figure 13D:
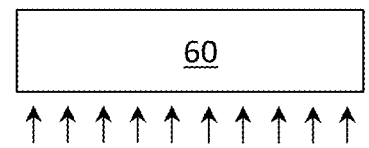
Figure 13E:
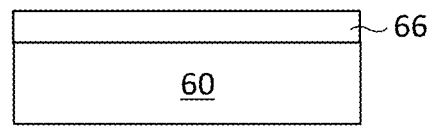

FIGS. 13A-E depicts cross-sections of a silicon substrate across various time points in the process of epitaxially growing a III-V layer on the surface of a silicon substrate, in accordance with one embodiment of the invention. FIG. 13A depicts silicon substrate 60 with a layer of native oxide 62. Native oxide 62 must be removed before the III-V layer can be grown on the surface of silicon substrate 60. FIG. 13B depicts the silicon substrate being exposed to hydrogen-containing plasma 64. FIG. 13C depicts the silicon substrate after the native oxide has been removed by the plasma. The silicon substrate has a defect level less than $5 \times 10^9$ defects per cm$^2$. FIG. 13D depicts the silicon substrate undergoing an anneal process. FIG. 13E depicts III-V layer 66 that has been epitaxially grown on the surface of the silicon substrate.

Figure 14:
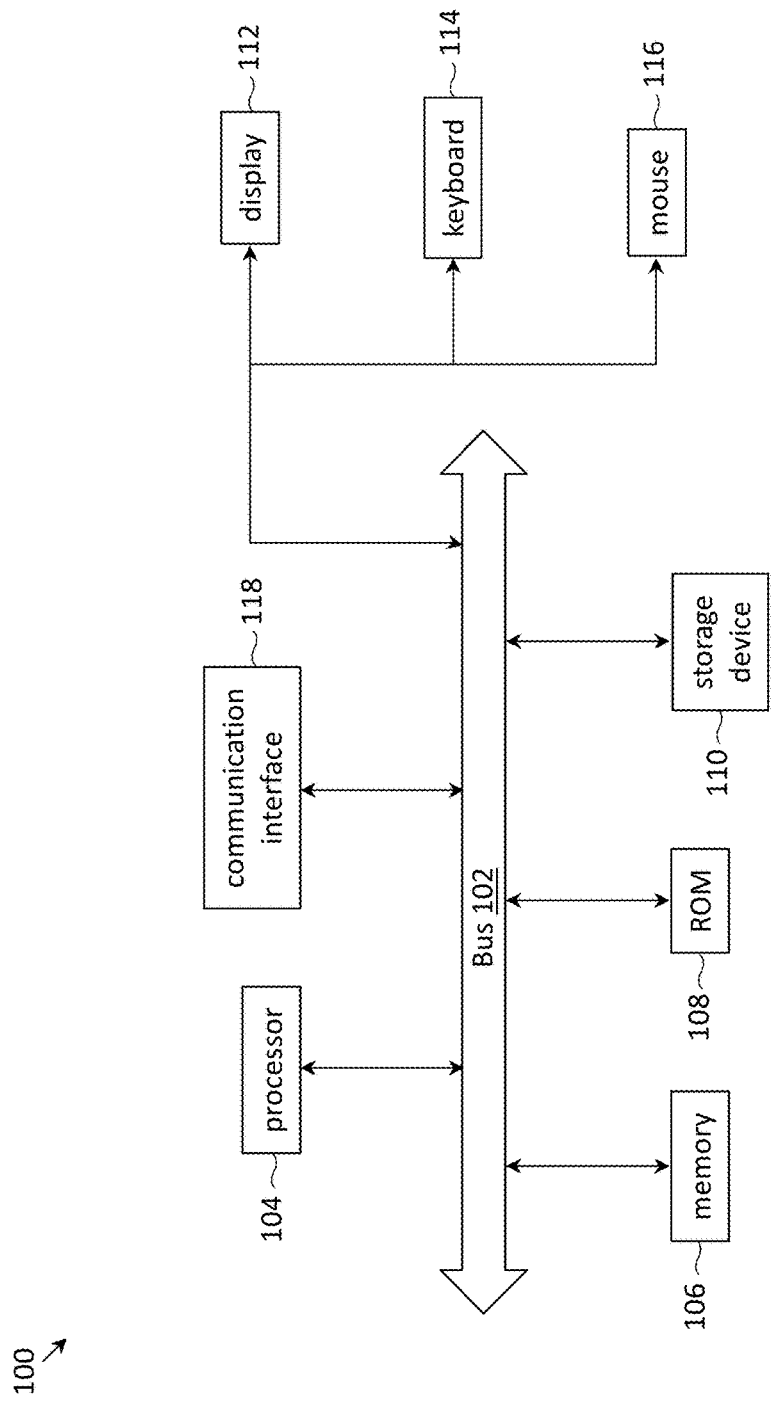
FIG. 14 depicts components of a computer system in which computer readable instructions instantiating (i.e., to carry out) the methods of the present invention may be stored and executed.

As is apparent from the foregoing discussion, aspects of the present invention involve the use of various computer systems and computer readable storage media having computer-readable instructions stored thereon. FIG. 14 provides an example of a system 100 that is representative of any of the computing systems (e.g., controller 50) discussed herein. Note, not all of the various computer systems have all of the features of system 100. For example, certain ones of the computer systems discussed above may not include a display inasmuch as the display function may be provided by a client computer communicatively coupled to the computer system or a display function may be unnecessary. Such details are not critical to the present invention.

System 100 includes a bus 102 or other communication mechanism for communicating information, and a processor 104 coupled with the bus 102 for processing information. Computer system 100 also includes a main memory 106, such as a random access memory (RAM) or other dynamic storage device, coupled to the bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to the bus 102 for storing static information and instructions for the processor 104. A storage device 110, which may be one or more of a floppy disk, a flexible disk, a hard disk, flash memory-based storage medium, magnetic tape or other magnetic storage medium, a compact disk (CD)-ROM, a digital versatile disk (DVD)-ROM, or other optical storage medium, or any other storage medium from which processor 104 can read, is provided and coupled to the bus 102 for storing information and instructions (e.g., operating systems, applications programs and the like).

Computer system 100 may be coupled via the bus 102 to a display 112, such as a flat panel display, for displaying information to a computer user. An input device 114, such as a keyboard including alphanumeric and other keys, may be coupled to the bus 102 for communicating information and command selections to the processor 104. Another type of user input device is cursor control device 116, such as a mouse, a trackball, or cursor direction keys for communicating direction information and command selections to processor 104 and for controlling cursor movement on the display 112. Other user interface devices, such as microphones, speakers, etc. are not shown in detail but may be involved with the receipt of user input and/or presentation of output.

The processes referred to herein may be implemented by processor 104 executing appropriate sequences of computer-readable instructions contained in main memory 106. Such instructions may be read into main memory 106 from another computer-readable medium, such as storage device 110, and execution of the sequences of instructions contained in the main memory 106 causes the processor 104 to perform the associated actions. In alternative embodiments, hard-wired circuitry or firmware-controlled processing units (e.g., field programmable gate arrays) may be used in place of or in combination with processor 104 and its associated computer software instructions to implement the invention. The computer-readable instructions may be rendered in any computer language. In general, all of the aforementioned terms are meant to encompass any series of logical steps performed in a sequence to accomplish a given purpose, which is the hallmark of any computer-executable application. Unless specifically stated otherwise, it should be appreciated that throughout the description of the present invention, use of terms such as "configuring", "processing", "computing", "calculating", "determining", "displaying", "receiving", "transmitting" or the like, refer to the action and processes of an appropriately programmed computer system, such as computer system 100 or similar electronic computing device, that manipulates and transforms data represented as physical (electronic) quantities within its registers and memories into other data similarly represented as physical quantities within its memories or registers or other such information storage, transmission or display devices.

Computer system 100 also includes a communication interface 118 coupled to the bus 102. Communication interface 118 may provide a two-way data communication channel with a computer network, which provides connectivity to and among the various computer systems discussed above. For example, communication interface 118 may be a local area network (LAN) card to provide a data communication connection to a compatible LAN, which itself is communicatively coupled to the Internet through one or more Internet service provider networks. The precise details of such communication paths are not critical to the present invention. What is important is that computer system 100 can send and receive messages and data through the communication interface 118 and in that way communicate with hosts accessible via the Internet.

Thus, methods and systems for pre-treating a surface of a substrate and growing an epitaxial III-V layer on the pre-treated surface have been described. It is to be understood that the above-description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus for preparing wafers prior to epitaxial deposition, the apparatus comprising:
    a dielectric vessel within a metal enclosure, the dielectric vessel forming a plasma volume which is in fluid communication with an exhaust manifold, and the exhaust manifold connected to a vacuum pumping line;

a support pedestal positioned adjacent to the plasma volume, the support pedestal configured to support a semiconductor wafer and raise a temperature of the semiconductor wafer to about 850° C.;

a supply of hydrogen gas and controller for controlling a flow thereof, the hydrogen gas flowed from the supply through tubing to one or more gas inlets of the dielectric vessel;

an induction coil disposed outside of and proximate to at least one side of the dielectric vessel;

a radio frequency (RF) power source connected through an impedance matching circuit to the induction coil;

a slotted electrostatic shield that is electrically grounded and positioned between the induction coil and the dielectric vessel; and a protective liner that is disposed inside of the dielectric vessel proximate to a surface of the dielectric vessel, wherein the protective liner comprises at least one of crystalline silicon or polycrystalline silicon.

2. The apparatus of claim 1, further comprising a gas injector nozzle coupled to the one or more gas inlets of the dielectric vessel, the gas injector nozzle extending from a surface of the dielectric vessel opposite the support pedestal at least one third of a distance from the surface of the dielectric vessel to the support pedestal.

3. The apparatus of claim 1, wherein the dielectric vessel is cylindrical in shape, and wherein a height of the dielectric vessel is less than half of a radius of the dielectric vessel.

4. The apparatus of claim 3, wherein the induction coil is disposed outside of and proximate to a top side of the dielectric vessel.

5. The apparatus of claim 1, further comprising a controllable gas supply for helium that is connected to the dielectric vessel.

6. The apparatus of claim 1, wherein the protective liner comprises polycrystalline silicon.

7. The apparatus of claim 1, wherein the protective liner comprises planar panels of lining material.

8. The apparatus of claim 1, wherein the protective liner comprises curved panels of lining material.

9. The apparatus of claim 1, wherein the protective liner is configured to partially protect top and side surfaces of the dielectric vessel from ion bombardment.

10. An apparatus for preparing wafers prior to epitaxial deposition, the apparatus comprising:

a dielectric vessel within a metal enclosure, the dielectric vessel forming a plasma volume which is in fluid communication with an exhaust manifold, and the exhaust manifold connected to a vacuum pumping line;

a support pedestal positioned adjacent to the plasma volume, the support pedestal configured to support a semiconductor wafer and raise a temperature of the semiconductor wafer to at least 300° C.;

a supply of hydrogen gas and controller for controlling a flow thereof, the hydrogen gas flowed from the supply through tubing to one or more gas inlets of the dielectric vessel;

an induction coil disposed outside of and proximate to at least one side of the dielectric vessel;

a radio frequency (RF) power source connected through an impedance matching circuit to the induction coil;

a slotted electrostatic shield that is electrically grounded and positioned between the induction coil and the dielectric vessel; and a protective liner that is disposed inside of the dielectric vessel proximate to a surface of the dielectric vessel, wherein the protective liner comprises at least one of crystalline silicon or polycrystalline silicon, wherein the protective liner comprises slots so as to allow a magnetic field of the induction coil to penetrate through the protective liner into the plasma volume.

11. An apparatus for preparing wafers prior to epitaxial deposition, the apparatus comprising:

a dielectric vessel within a metal enclosure, the dielectric vessel forming a plasma volume which is in fluid communication with an exhaust manifold, and the exhaust manifold connected to a vacuum pumping line;

a support pedestal positioned adjacent to the plasma volume, the support pedestal configured to support a semiconductor wafer and raise a temperature of the semiconductor wafer to at least 300° C.;

a supply of hydrogen gas and controller for controlling a flow thereof, the hydrogen gas flowed from the supply through tubing to one or more gas inlets of the dielectric vessel;

an induction coil disposed outside of and proximate to at least one side of the dielectric vessel:

a radio frequency (RF) power source connected through an impedance matching circuit to the induction coil;

a slotted electrostatic shield that is electrically grounded and positioned between the induction coil and the dielectric vessel;

a protective liner that is disposed inside of the dielectric vessel proximate to a surface of the dielectric vessel, wherein the protective liner comprises at least one of crystalline silicon or polycrystalline silicon;

a residual gas analyzer, wherein a sampling port of the residual gas analyzer is in fluid communication with the exhaust manifold; and an automatic process controller configured to control the supply of hydrogen gas and the RF power source, the automatic process controller further configured to receive information on a concentration of contaminant from the residual gas analyzer for determining when to terminate a process for preparing the semiconductor wafer prior to epitaxial deposition.

12. An apparatus for preparing wafers prior to epitaxial deposition, the apparatus comprising:

a dielectric vessel forming a plasma volume, the plasma volume in fluid communication with an exhaust manifold, and the exhaust manifold connected to a vacuum pumping line;

a support pedestal positioned adjacent to the plasma volume, the support pedestal configured to support a semiconductor wafer and raise a temperature of the semiconductor wafer to at least 300° C.;

a supply of hydrogen gas and controller for controlling a flow thereof, the hydrogen gas flowed from the supply through tubing to one or more gas inlets of the dielectric vessel;

an induction coil disposed outside of and proximate to at least one side of the dielectric vessel;

a radio frequency (RF) power source that is connected through an impedance matching network to the induction coil;

a slotted electrostatic shield that is electrically grounded and is positioned between the induction coil and the dielectric vessel; and at least one crystalline silicon restriction element positioned in an opening connecting the plasma volume to the exhaust manifold, the crystalline silicon restriction element configured to prevent plasma in the plasma volume from flowing into the exhaust manifold, wherein the crystalline silicon restriction element is attached to the dielectric vessel.

13. The apparatus of claim 12, wherein at least one crystalline silicon liner is positioned proximate to an inner wall of the dielectric vessel.

14. The apparatus of claim 12, wherein a gas injector extends from a center of a top side of the dielectric vessel opposite the support pedestal, at least a third of a distance from the top side of the dielectric vessel to the pedestal.

15. A method for pre-cleaning and reconstructing a surface of a wafer prior to epitaxial deposition, the method comprising:
   placing the wafer on a support pedestal located adjacent to a plasma volume formed within a dielectric vessel, the plasma volume in fluid communication with an exhaust manifold connected to a vacuum pumping line;
   injecting a controlled flow of a first gas into the plasma volume;
   supplying radio frequency (RF) power, from an RF power source, through an impedance matching circuit to an induction coil located outside of and proximate to at least one side of the dielectric vessel, thereby sustaining a first plasma within the plasma volume that removes contaminants from the wafer, wherein a slotted electrostatic shield is electrically grounded and positioned between the induction coil and the dielectric vessel;
   detecting, by a residual gas analyzer, a concentration of contaminant in the exhaust manifold;
   terminating the RF power to the induction coil and terminating the flow of hydrogen gas when the concentration of contaminant detected by the residual gas analyzer falls below a pre-determined level;
   heating, by the support pedestal, the wafer to at least 700° C.;
   injecting a second gas into the plasma volume; and
   supplying RF power, from the RF power source, through the impedance matching circuit to the induction coil located outside of and proximate to at least one side of the dielectric vessel, thereby sustaining a second plasma within the plasma volume, the second plasma in conjunction with heat from the support pedestal heating the wafer to at least 750° C. so as to reconstruct a crystalline surface of the wafer for hetero-epitaxy of a thin film,
   wherein a lining protects a surface of the dielectric vessel from etching and sputtering by the first and second plasmas, thereby substantially preventing contaminants from being released into the plasma volume, wherein the lining comprises at least one of crystalline silicon or polycrystalline silicon.

16. The method of claim 15, wherein the first gas is injected into the plasma volume through a gas injector nozzle disposed within the dielectric vessel, the gas injector nozzle connected to at least one gas inlet disposed on a top side of the dielectric vessel located opposite the support pedestal, and extending at least a third of a distance from a top surface of the dielectric vessel towards the support pedestal.

17. The method of claim 15, wherein the flow of the first gas is terminated when a concentration of oxygen in the exhaust manifold, as detected by the residual gas analyzer, falls below 1 ppm.

18. The method of claim 15, wherein the pre-cleaning and reconstruction of the surface of the wafer achieves a defect concentration of less than $5\times10^9$ defects per $cm^2$.

19. The method of claim 15, wherein the first gas is injected so that it flows through the dielectric vessel and around the support pedestal to the exhaust manifold without recirculation in the dielectric vessel.

20. The method of claim 15, wherein the first gas comprises hydrogen and the second gas comprises at least one of Helium, $NF_3$, $F_2$ or $H_2$.

* * * * *